United States Patent [19]
Gebhardt et al.

[11] Patent Number: 5,718,789
[45] Date of Patent: Feb. 17, 1998

[54] METHOD FOR MAKING A DEBOSSED CONDUCTIVE FILM COMPOSITE

[75] Inventors: William F. Gebhardt, Pleasant Hill; Rocco Papalia, Antioch, both of Calif.

[73] Assignee: The Dexter Corporation, Pittsburgh, Calif.

[21] Appl. No.: 483,342

[22] Filed: Jun. 7, 1995

[51] Int. Cl.$^6$ ............................................ H05K 3/20
[52] U.S. Cl. .................... 156/154; 156/219; 156/307.7; 29/846; 29/848
[58] Field of Search .................. 156/307.7, 151, 156/153, 154, 219, 330, 332; 29/846, 848, 849

[56] References Cited

U.S. PATENT DOCUMENTS

| | | |
|---|---|---|
| 2,772,501 | 12/1956 | Malcolm . |
| 2,955,351 | 10/1960 | McCreadie . |
| 2,986,804 | 6/1961 | Greenman et al. . |
| 3,037,265 | 6/1962 | Kollmeier . |
| 3,201,238 | 8/1965 | Dwyer . |
| 3,209,066 | 9/1965 | Toomey et al. . |
| 3,303,254 | 2/1967 | Simons . |
| 3,660,088 | 5/1972 | Lundsager ............................ 96/36 |
| 3,990,142 | 11/1976 | Weglin . |
| 4,059,479 | 11/1977 | Tanazawa . |
| 4,323,421 | 4/1982 | Klein . |
| 4,363,930 | 12/1982 | Hoffman . |
| 4,374,457 | 2/1983 | Wiech, Jr. . |
| 4,550,051 | 10/1985 | Spielau et al. . |
| 4,601,916 | 7/1986 | Arachtingi . |
| 4,614,837 | 9/1986 | Kane et al. . |
| 4,662,973 | 5/1987 | Gotou et al. ............................ 156/332 |
| 4,812,421 | 3/1989 | Jung et al. . |
| 4,816,427 | 3/1989 | Dennis . |
| 4,827,611 | 5/1989 | Pai et al. . |
| 4,831,723 | 5/1989 | Kaufman . |
| 4,886,686 | 12/1989 | Muenstedt . |
| 4,912,844 | 4/1990 | Parker . |
| 4,944,087 | 7/1990 | Landi . |
| 4,944,908 | 7/1990 | Leveque et al. . |
| 4,969,257 | 11/1990 | Sato et al. . |
| 4,994,316 | 2/1991 | Browne et al. . |
| 4,997,702 | 3/1991 | Gazit et al. . |
| 5,002,818 | 3/1991 | Licari et al. . |
| 5,030,144 | 7/1991 | Seidler . |
| 5,090,122 | 2/1992 | Kitagawa . |
| 5,108,825 | 4/1992 | Wojnarowski et al. . |
| 5,153,987 | 10/1992 | Takahashi et al. . |
| 5,168,624 | 12/1992 | Shirai . |

(List continued on next page.)

FOREIGN PATENT DOCUMENTS

| | | |
|---|---|---|
| 163856 | 12/1985 | European Pat. Off. . |
| 3062935 | 3/1991 | Japan . |

*Primary Examiner*—Michael W. Ball
*Assistant Examiner*—Michael A. John
*Attorney, Agent, or Firm*—Dorsey & Whitney LLP

[57] ABSTRACT

Processing of materials and their combination to produce a thin foil-laminated adhesive dielectric thermosetting resin film and the conversion of it by a mechanical debossing procedure to impart a debossed and/or embossed printed circuit pattern directly thereon. A process for compositing a shaped metal foil containing a debossed electrical circuitry pattern and an thin isotropic uncured and ungelled thermosetting resin film and forming an adhesively joined composite conforming essentially to the shape of the predebossed metal foil. The process comprises placing a shaping tool with a surface possessing an embossed electrical circuitry pattern, as described in the prior art, and forcing the shaped surface and a surface of the metal foil into intimate contact to deform the metal foil to assume essentially the shape of the tool surface. The shaped metal foil is separated from contact with the tool surface. The separated metal foil is placed in contact with a thin isotropic uncured and ungelled thermosetting resin film. It is forced into the film without significantly altering its shape. This causes the film to deform and assume the shape of the foil. The condition associated with the film in contact with the foil are such that the film assumes a set condition and the foil is adhesively bonded to the film.

63 Claims, 4 Drawing Sheets

U.S. PATENT DOCUMENTS

| | | |
|---|---|---|
| 5,206,074 | 4/1993 | Davis et al. . |
| 5,260,130 | 11/1993 | Sakaguchi et al. . |
| 5,288,542 | 2/1994 | Cibulsky et al. . |
| 5,334,279 | 8/1994 | Gregoire . |
| 5,343,616 | 9/1994 | Roberts ..................................... 29/846 |
| 5,346,747 | 9/1994 | Vancho et al. . |
| 5,351,393 | 10/1994 | Gregoire . |
| 5,390,412 | 2/1995 | Gregoire . |

METHOD FOR MAKING A DEBOSSED CONDUCTIVE FILM COMPOSITE

RELATED APPLICATIONS

This application is related to copending applications Ser. No. 08/488,469 (Attorney's Docket No. 4235 [HY030]) Ser. No. 08/474,929 (Attorney's Docket No. 4236 [HY031]) Ser. No. 08/474,439 (Attorney's Docket No. 4237 [HY032]) each of which was filed on even date herewith.

BRIEF DESCRIPTION OF THE INVENTION

A method of making a printed circuit precursor which comprises adhesively bonding an electrically conductive metal foil directly to a moldable, dielectric thin thermosetting resin film wherein the thermosetting resin layer has an unimpeded thickness that is at least equal to that of the foil layer bonded to it, to form a conductive film composite. It invokes precisionally debossing a printed circuit pattern into the metal foil surface and then conjoining the metal foil to the thermosetting resin layer to transmit the debossed pattern to the resin film. The debossed pattern comprises the grooves and sockets suitable for a printed board. The debossed conductive film is heated to cause the thermosetting resin to gel, near-gel or cure thereby setting the thermosetting resin.

BACKGROUND TO THE INVENTION

The term "printed board" ("PB") is understood to be a general term for completely processed printed circuit or printed wiring configurations. It includes rigid or flexible boards (organic or ceramic) and single, double, and multilayer printed boards. A "printed wiring board ('PWB')" is a subset of the PB. It is a board with only printed-on point-to-point connections. A "printed circuit board" is another subset of PB. It is a board with printed-on components as well as point-to-point connections. In the following description, reference to PB's is intented to encompass PWB's and PCB's.

A typical PB is a flat board that holds chips and other electronic components. The board is made of fiberglass reinforced thermosetting resin laminate. It interconnects components via conductive metal pathways. The typical resins used in making PB's are brominated bisphenol A type epoxy resins, bis-maleimide resins and polyimide resins. The resin is typically impregnated into a fiberglass fabric and with compression molding. The impregnated fabris (the "prepreg") is laminated into a multi-ply structure, containing as many as 4 or more plies. Such a structure provides a high fiberglass to resin ratio.

The conventional printed circuit is an etched circuit. It is made by a photo imaged chemical etch process. A copper foil laminate is covered with a photoresist. U.V. light is shined through a negative image of the circuit paths onto the photoresist, hardening the areas that will remain after etching. The piece is then treated to remove the unhardened areas of the photoresist. When passed through an acid bath (e.g., ferric chloride solution), the exposed copper is etched away. The hardened areas of photoresist are stripped off. An oxide treatment is applied to the copper to achieve proper bonding to the next layer of laminate or for the top layer, a solder mask layer is applied. A similar process creates the micro-miniaturized circuits on a chip.

In particular, the electrical laminates used in PB's comprise thermosetting resin as described immediately below, impregnated glass continuous filament fiber or fabric systems which are combined with copper foil and pressed in a multi-daylight press into laminates. Laminates have either one or both sides clad with copper. Resin matrix-reinforcing systems range from moderately inexpensive materials such as phenolic/paper laminates or polyester/glass to general purpose epoxy/glass known as FR-4 to high performance (expensive) systems based on bismaleimide-triazine (BT)/glass or polyimide (PI)/glass. Most laminates are pressed/cured in multi-opening presses. At least one company manufactures an epoxy/polyester hybrid copper laminate in a continuous operation.

These different electrical laminates are distinguishable thermally by comparing their respective Tg's:

|  | $T_g$, °C. |
|---|---|
| Phenolic/Paper | 90 |
| Polyester/Glass | ~100 |
| Epoxy/Glass | ~125 |
| BT/Glass | 225 |
| PI/Glass | 260 |

Hybrids of these above resin matrices are coated onto glass and pressed/cured into laminates with intermediate Tg's:

|  | $T_g$, °C. |
|---|---|
| Epoxy/BT-glass | 160–200 |
| Epoxy/PI-glass | 200–260 |

The FR-4 varnish which is coated onto glass is a complex mixture of epoxy resins, catalyst, amine accelerator and solvents. Glass reinforced prepreg of brominated epoxy resin catalyzed by dicyandiamide (dicy) with an amine accelerator is "B staged" into dry prepreg sheets with flow varying from 8 to 30%. Flow values aid in selecting the proper press/cure cycle in the manufacture of multi-ply (FR-4) copper clad laminates. Typically these multiply prepregs are combined with copper foil and pressed in a multi-opening press at as high as 1000 psi, 350° F. and require 30 to 60 minutes for complete cure. A schematic of the overall operation is illustrated in FIG. 3.

Some excess resin flash that must be trimmed develops on the sides of the laminate and results in laminate variability. Caul plates, used in pressing the laminates, periodically build up epoxy residue causing laminate imperfections and rough surfaces. After many pressings, caul plates must be cleaned by a costly grinding/resurfacing or chemical operation.

A maximum level of resin cure is essential for ultimate mechanical properties and dimensional ability for stress free laminates. If not properly cured, problems are amplified during the ensuing processing steps leading to a PB. A partially or incompletely cured laminate causes resin smear (flow) during the drilling operation (aligning and assembling laminates into multi-layer boards). Resin flow and deposits on drill bit cause misalignment and possible rejection of the completed PB during final testing.

Mechanical and electrical properties comparison of phenolic paper and epoxy/glass (FR-4) clearly identify FR-4 as the superior material. On a cost performance basis, the FR-4 board is the predominant material for PB in the U.S. With more pre-assembled devices (surface mount devices) and a significant shift to multi-layer boards, the thermal/mechanical limits of FR-4 are being exceeded by lengthy thermal excursions caused by newer assembly technologies.

A significant problem associated with double-sided and multi-layer boards (MLB) is plated through hole (PTH). The process of forming the copper plated through hole involves fabricating holes through each of the laminate layers, preparing the hole for plating, sensitizing the hole with electroless copper and finally electroplating with copper to the desired thickness. Studies have shown that PTH can only survive "few thermal cycles" (Z axis expansion of FR-4) before copper fatigue/failure occurs. One company reports 220 ppm/°C. for Z axis FR-4 by TMA mid-point between 50° C. and 250° C. The mismatch of coefficient of thermal expansion ("CTE mismatch") between the copper "barrel" PTH and FR-4 results in cracked pads, barrels and/or layer delamination.

This point is described by Harper and Miller, *Electronic Packaging, Microelectronics, and Interconnection Dictionary*, McGraw-Hill, Inc:, New York, N.Y., 1993, in their definition of "Z Axis":

"(1) The direction through the thickness of a substrate, a feature especially important for printed wiring board laminates, since thermal expansion in the Z axis is much higher than in the X-Y [sic] axis. This is because the resin in the laminate controls the Z axis thermal expansion, whereas the fabric in the laminate controls the X-Y axis thermal expansion. Resins have much high[er] thermal expansions than do fabrics. The direction perpendicular to the fibers in a woven fiber-reinforced laminate—namely, through the thickness of the laminate. Thermal expansion is much higher in the Z axis, since this expansion is more controlled by the resin in the laminate."

There are a number of improvements with respect to PB manufacture that are sought by the industry. One is in the area of cost reduction. Another relates to reduction in the capital investment of a production line to produce PB's. A third improvement involves the environmental problems that plague the current processes for making PB's. A fourth improvement is a greater circuit density that requires finer lines and spaces.

For example, the photo imaging and etch processes involve expensive capital equipment and hazardous chemicals. A photoresist coater is required, followed by a UV exposure machine, followed by a rinse that generates contaminated water waste. This is followed by an etching line that usually consists of 2 to 5 etch tanks and 10 to 15 rinse tanks, all of which generate toxic waste.

The essence of a PB is to provide the circuit pathways carrying electrical pulses from one point to another. The pulses flow through on/off switches, called transistors, located in chips, which open or close when electrically activated. The current flowing through one switch effects the opening or closing of another and so on. Small clusters of transistors form logic gates, which are the building blocks behind all this magic, and a specific combination of logic gates make up a circuit.

Today's chip is typically an integrated circuit. Chips are squares or rectangles that measure approximately from 1/16th to 5/8th of an inch on a side. They are about 1/30th of an inch thick, although only the top 1/1000th of an inch holds the actual circuits. Chips contain from a few dozen to several million electronic components (transistors, resistors, etc.). The terms chip, integrated circuit and microelectronic are synonymous. Chips are generally characterized by their function.

The chip relies on single crystal silicon wafers onto which an electrical circuit is provided. Layers of these wafers can be used to define the function of the chip. The crystal is then placed in a lead frame, with extending copper and nickel alloy leads. The frame is packaged (encapsulated) with an epoxy molding compound such as an epoxy cresol novolac ("ECN") resin. The encased chip is adhesively bonded to the PB with an epoxy resin adhesive that requires heat to cure. The chip leads are then bonded, e.g., by soldering, to the PB's metal circuitry.

The current PB technology is reaching its limits in terms of how fine circuit lines can be made economically while the decreasing sizes of portable electronic equipment will demand even finer lines.

It is well recognized that a byproduct of miniaturization of a PB and a chip is speed. The shorter the distance a pulse travels, the faster it gets there. Greater miniaturization allows greater area availability for more circuitry, thus allowing for more functions to be added to the circuit. The smaller the components making up the transistor, the faster the transistor switches. The same effect holds true with respect to a PB. Switch times of transistors are measured in billionths and trillionths of a second. In fact, a Josephson junction transistor has been able to switch in 50 quadrillionths of a second. Thus a tremendous impetus exists to reduce the size of chips and PB's, and in the case of PB's, to reduce the distance between interconnected functions on the PB.

George D. Gregoire, Dimensional Circuits Corp., San Diego, Calif., 92126 in a paper entitled "Fine-line 'Grooved' Circuitry—A New PB Process for SMT," describes an evaluation of his process in making and employing common PB in surface mount technology (SMT) application, which is in part the technology described in U.S. Pat. Nos. 4,919, 844 and 5,884,979. [Surface mounting is a circuit board packaging technique in which the leads (pins) on the chips and components are soldered on top of the board, not through it. As a result, boards can be smaller and built faster] From this analysis, Mr. Gregoire defines what he calls "an improved circuit trace geometry and manufacturing process for PB's containing 'grooved traces' or 'dimensional circuitry.'"The manufacturing process employs a hot stamping approach to form dimensional circuits. According to the author, major parts of the process embrace:

molding is effected in a laminating press with ordinary panel-sized laminate materials (e.g., epoxy-glass, polyimide, etc.) in prepreg form;

tooling cost, even for low volume, is nominal;

chemicals and steps used for copper metallization is traditional, yet high, benchmark-level FIG. 4, adhesion is achieved, as high as for preclad PB's;

the following traditional PB production steps are omitted:
production phototooling (film)
dryfilm plating resist
film-to-PB registration (features are molded in)
imaging
developing, and
possibly, solder resist in its entirety.

A small amount of common etch resist is used in a "self-locating" way, bladed on, with no registration steps required. The resist is stated to be retained, and protected in the grooves, below the surface, during etching.

In defining the significance of this technology to users, Gregoire states that it dramatically improves soldering yields during fine-pitch surface mounting. He states that groove circuits provide yield improvements in the self-locating feature during assembly because the grooves or channels allow SMT IC leads to automatically self-locate. The self-locating feature provides yield and quality (e.g., much higher lead pull strength) improvements. The wide, funnel-shaped and deep channels completely wick and fill with solder, making automatic allowance for the skew and out-of-planarity problems that come with high lead count, fine-pitch ICs.

A significant deficiency of the molding step of this process is its use of thermosetting resins in prepreg form, which means that the prepreg sheet contains a glass fiber fabric to reinforce the epoxy resin. The specific ones mentioned are epoxy-glass, and polyimide, without specifying the fiber. In the latter case, it is assumed that the fiber is glass fiber. That requires the hot stamping into an unyielding fiber mass that restricts resin flow and resists well-defined debossment. Moreover, a resin-glass fiber prepreg creates a anisotropic substrate creating CTE mismatches for any copper layer deposited thereon, due to the surface irregularity of that material. As pointed out above, this results in "cracked pads, barrels and/or layer delamination," clearly indicating why such a substrate is not favored by Gregoire.

Parker, U.S. Pat. No. 4,912,844, describes punching an optionally planar surface with a punch that may be heated to impart grooves and cavities in the surface. The punch may have foil disposed on it so that it is transferred to the substrate and in the grooves and cavities in the substrate. The portions of the foil on the surface of the substrate may be removed by printed circuit techniques or machining or laser techniques so that only the portions of the foil in the grooves and the cavities remain. FIGS. 5–8 of the patent list alternative steps in producing a printed circuit. They are listed in the following table:

| FIG. 5 | FIG. 6 | FIG. 7 | FIG. 8 |
|---|---|---|---|
| Dispose a mark on a flat surface of a punch. | Machine or laser cut the punch to create raised portions. | Start with a flat sunface of a punch | Press metal foil around punch to make foil conform to raised portions of the punch. |
| Photo expose an image of desired grooves and holes on the mask of the punch. | Heat the punch to an elevated temperature. | Coat the flat surface with a photo-resist material in a pattern corresponding to the desired pattern of grooves and holes in the substrate. | Heat punch and foil to an elevated temperature. |
| Etch the photo exposed image of the grooves and holes on the mask. Plate the etched portion of the mask to fill the holes and grooves in the mask. | As an alternative or as an additional step, heat the substrate. Apply the punch to a surface of the substrate to form the grooves and holes in the substrate. | Remove the portions of the punch without the photo-resist material. Harden the photo-resist material on the substrate. | As an alternative or as an additional step, heat the substrate. Press foil on and into surface of substrate to produce grooves and holes in the substrate. |
| Remove mask from punch. | Remove the punch from the substrate. | Heat the punch to an elevated temperature. | Remove foil from surface of substrate while retaining foil in grooves and hole in substrate. |
| Heat the punch to an elevated temperature. | Dispose electrical components in the holes in the substrate. | As an alternative or as an additional step heat the substrate. | Dispose electrical components in the holes in the substrate. |
| As an alternative or as an additional step, heat the substrate. | Apply an electrically conductive material such as solder to the grooves in the substrate to establish electrical continuity with the electrical components. | Apply the punch to a surface of the substrate to form the grooves and holes in the substrate. | Apply an electrically conductive material such as solder to the grooves in the substrate to establish electrical continuity with the electrical components. |
| Apply the punch to a surface of the substrate to form the grooves and holes in the substrate. | | Remove the punch from the substrate. | |
| Remove the punch from the substrate. | | | |
| Dispose electrical components in the holes in the substrate. | | Dispose electrical components in the holes in the substrate. Apply an electrically conductive material such as solder to the grooves in the substrate to establish electrical continuity with the electrical components. | |
| Apply an electrically conductive material such as solder to the grooves in the substrate to establish electrical continuity with the electrical components. | | | |

An advantage of the PB procedure of U.S. Pat. No. 4,912,844, is the exploitation of grooves and cavities in the board to provide the printed circuit. This allows one to create the surface area needed for obtaining low electrical resistance in the wiring placed in the grooves and associated with the cavities. Note that the depth of the grooves are preferably at least as great as the widths of the grooves and since the solder can fill the grooves, the widths of the grooves can be made quite small while still retaining relatively low electrical resistance. In a number of instances, such as at column 4, lines 9–19, column 5, lines 4–8, lines 9–16, lines 18–19, the patent utilizes heating of the substrate to deform it, using temperatures up to the melting temperature of the substrate. This demonstrates that the substrate must be heated above a glass transition temperature in order to achieve flow. On the other hand, the patent also states that the PB's can be made of a ceramic or an epoxy-glass material. In addition, the patent states that the substrate may also be made of high temperature thermoplastic-or thermosetting materials without specifying what they may be or their properties. The patent is devoid of details on how the metal foil is bonded to the thermosetting or thermoplastic substrate, and how one avoids a CTE mismatch, as characterized above. For example, a metal foil will not tightly bond to a thermoplastic substrate even if the substrate is melted in contact with the foil; an adhesive is required to effect reasonable bonding of the foil to the thermoplastic substrate. This appears to be recognized in the Gregoire's recently issued U.S. Pat. No. 5,390,412 that specifies the use of an "adhesion promote coating" that involves forming a "dendritic oxide coating" by bathing in a "water base bath" in order to bond an electroplated copper layer to a dielectric substrate.

Gregoire, U.S. Pat. No. 5,334,279, relates to a PB tool for producing three-dimensional PB's having grooves with strongly bonded or laminated metallic pads therein. The circuit board tool comprises a metallized male mold substrate having a plurality of groove forming projections. The metalized mold substrate is made from a female parent or predecessor master tool. The patent articulates a three-dimensional PB that employs a high heat deflective plastic, without defining the plastic, and a plurality of recesses or grooves molded into the substrate surface for receiving the fine pitch, closely spaced-apart leads, of an integrated circuit.

Gregoire, U.S. Pat. No. 5,351,393, is another patent in this area. The Gregoire and Parker patents, all assigned to Dimensional Circuits Corp., directed to technology for simplifying PB manufacture, demonstrate the complexity of making tools and making PB's from the tools. One of the reasons for such complexity is that the materials of construction that are used for tool making and for printed wire boards are undefined or improperly designed for a simple and effective PB construction that avoid CTE mismatches and for making tools that can be used in shaping plastics and resins into printed wire board substrates, whether containing or not containing grooves and cavities.

The art of making PB's is restricted by the processes and material from which they are made. Labor intensive techniques such as stenciling, silk screening, masking, etching, and the like, drive up the cost of PB's. There is a need for a simple and cost effective method for making PB's that has the capacity of minimizing the required use of labor intensive techniques.

There are descriptions in the art referring to press stamping of foil and thermosetting resins and thermoplastic polymers. Those descriptions merely characterize the forming of debossed surfaces, such as grooves, channels and cavities, in a composite of foil and resin/thermoplastic without defining with reasonable precision the materials from which the composite is formed. To the extent that materials are defined, they are generically and very generically described. For example, as noted above, an epoxy-glass prepreg was described in U.S. Pat. No. 4,912,844, without any characterization of the epoxy resin or the glass filament reinforcement. The same is true with respect to selection of thermoplastic polymer. In addition, there is no definition of the dimensions of the resin/thermoplastic polymer component in the composite.

Thin metal foils are very easy to deboss. A stamp press can be used to impart grooves, channels and sockets in a metal foil. The depth of such debossment can be quite large or nearly "infinitesimally" small. However, such foil is flimsy, and lacks strength and rigidity. Conventional thermosetting resin formulations are difficult to shape into thin films, in particular, to thin films that can be debossed so as to retain a debossed and/or embossed circuitry image in the film. Such films, on standing and when heated to effect cure without edge restraint, lose definition of any or substantially all of the impressed debossed pattern even when affixed to the mold. In addition, a conventional thermosetting resin may not have the adhesive properties to adequately bond to a metal foil during a lamination procedure though the art possesses substantial knowledge about thermosetting adhesives that bond to metal foils such a copper foil. As noted above, U.S. Pat. No. 5,390,412 requires the creation of an oxide layer interface between the metal foil and the dielectric substrate in order to achieve bonding. More importantly, in such laminate construction, a conventional thermosetting resin may not properly flow in a debossing process so as to form a desirable bond between the foil and resin films coupled with a satisfactory debossed/embossed pattern in the composite. This is especially the case with compositing a metal foil and a thermoplastic film. High performance thermoplastic polymers, commonly characterized as performance polymers and engineering polymers, do not possess good adhesive properties. A metal foil film stamp pressed into such a polymer film will possess weak adhesion rendering the composite unsuitable for most applications, and assuredly so with respect to PB's.

The Invention

This invention relates to the processing of materials and their combination to produce a thin foil-laminated adhesive dielectric thermosetting resin film and the conversion of it by a mechanical debossing procedure to impart a debossed and/or embossed printed circuit pattern directly thereon. This invention is used to form a thin film PB or any other fine line circuitry elements that avoid CTE mismatches. The invention also relates to the formation of a PB from these components.

More particularly, this invention relates to a process for compositing a shaped metal foil containing a debossed electrical circuitry pattern and an uncured and ungelled thermosetting resin film and forming an adhesively joined composite conforming essentially to the shape of the metal foil. The process comprises placing a shaping tool with a surface possessing an embossed electrical circuitry pattern, as described in the prior art, and forcing the shaped surface and a surface of the metal foil into intimate contact whereby to deform the metal foil to assume essentially the shape of the surface. The shaped metal foil is separated from contact with the surface. The separated metal foil is placed in contact with a thin uncured and ungelled thermosetting resin film. It is forced into the film without significantly altering its shape. This causes the film to deform and assume the shape of the foil. The ambient condition associated with the film in contact with the foil are such that the film assumes a set condition and the foil is adhesively bonded to the film.

This invention relates to the use of a thin isotropic thermosetting resin film that is amenable to being subjected to a debossing procedure by light compression with a debossed metal foil that has an imparted printed circuit pattern thereon. The thin isotropic thermosetting resin film properly composited with the metal foil avoids the aforementioned CTE deficiencies of an anisotropic fabric prepreg. The composite can be made by pressing the debossed metal foil into the isotropic thermosetting resin film with minimal loss of debossment precision of the debossed metal foil. This results in a composite (laminate) that can eventually be used to generate a printed circuit board that is devoid of CTE mismatch, or for forming a tool useful in effecting the debossment procedure.

The thin thermosetting resin film has the capacity of being precision molded with the debossed metal foil at a relatively low temperature, such as temperatures as low as room temperature (~23.5° C.), with superior duplication of the pattern molded into the metal foil.

In particular, the invention includes a method of making a thin thermosetting resin film that is amenable to being subjected to a debossing procedure with a debossed metal foil, debossing a metal foil such that it possesses a grooved electrical circuit pattern therein, combining the resin film and the debossed metal foil, and causing the foil and resin film to mate whereby the grooved printed circuit pattern in the foil is transferred to the resin film. Then the film and foil are composited to form an adhesively joined laminate by subjecting the resin to conditions that advance it to a set condition. This is accomplished with minimal loss of debossment precision of the grooved pattern in the foil. The printed circuit pattern with the grooving within the foil can be fixed by the thermoset state of the adhesively bound thermoset resin. The resulting composite can be used to form a PB.

In addition, the thin thermosetting resin film is amenable to being subjected to flow into the grooves and cavities of a female molded foil, as defined above, whereby to form a male replication of the female shaped foil. By subjecting the resin to temperatures sufficiently high enough to cure the resin, then a laminate is formed that causes the conjoining surface of the resin film to replicate a male image of the female surface of the molded foil. In this manner, the composite of the invention is convertible into a male tool for making a PB by stamping another foil or film.

It has been determined that metal foil sheets that are debossed to form an embossed surface replicative of an electrical circuit pattern that would be used in forming a PB, have the capacity of debossing a thin uncured thermosetting resin film possessing an unimpeded thickness to such debossment. Such can be effected without a mechanical supporting surface for the debossed portions of the foil.

It has been found that thin uncured dielectric thermosetting resin films, properly formulated and containing an unimpeded thickness, can be sufficiently directly bonded to a heat and electrically conductive metal foil to form a composite that can be debossed through the foil surface to retain the debossed/embossed pattern in the metal foil and the attached resin film of the composite. The composite can be subjected to conditions that effect cure of the thermosetting resin, and the thermoset resin provides a dielectric substrate. For example, that debossed/embossed laminate can then be subjected to an elevated temperature while the composite is free of the debossing mold that was used to shape the foil, to gel, near-gel or cure the adhesive resin formulation. Such gelling or near-gelling, and cure fixes the debossed/embossed pattern in the metal foil layer and the resin layer of the composite sufficient for curing and/or post curing the composite, as the case may be. This can be effected with minimal loss of debossment/embossment precision for eventually generating a PB or for forming a tool useful in effecting the debossment procedure. The debossed/embossed pattern can replicate an electrical circuit typical of the most complicated PB's industrially available. The foil and the resin film can be extremely thin and the composite can have a thickness thinner than most of the commercially available PB's, and typically as thin as the most advanced state of the art PB's. Of particular desirability is that the mechanical debossment process allows for the generation of exceedingly fine line debossed and/or embossed electrical circuitry in the device.

The composite of the invention can include a thin layer of thermoplastic polymer, such as a performance or engineering plastic. The thin layer of thermoplastic polymer contacts the uncured thermosetting resin adhesive film which in turn contacts the metal foil. Thus, the three-layer laminate precursor comprises a metal foil layer that in combination with the thermoplastic polymer film layer, sandwich the thermosetting resin adhesive film layer. The laminate can be debossed/embossed at a cure, near-gel or gel temperature of the thermosetting resin through the metal foil surface, so that debossment is transmitted through the thermosetting resin layer and into the thermoplastic polymer layer.

The thin foil-laminated dielectric thermosetting resin film has the capacity of being precision stamp molded through the thin foil surface by first stamping the metal foil with a patterned tool. The pattern comprises embossed fine lines characteristic of the electrical circuit of a PB. The stamping causes debossment/embossment of the foil to form a debossed and/or embossed electrical circuit pattern comprising grooves, cavities, channels, ridges, sockets and/or plateaus (raised segments), and the like. This can be effected at a relatively low temperature, such as temperatures as low as room temperature (~23.5° C.) or lower, with superior duplication of the pattern. That same pattern can be retained in the eventually cured resin laminate. The debossed foil is then put in contact with the thin resin film: either the film is superimposed on the foil or the foil is superimposed on the film. Because the electrical circuitry is formed by debossment into the thermosetting resin, the space that the circuitry occupies on the surface of the board is much smaller than the space of circuitry in a comparable conventional flat board PB's. The amount of deposited metal in each circuit line debossed into the thermosetting resin provides the desired level of conductance while the surface area of the board occupied by the circuit line is much less. Because of the finer circuit lines that can be provided, a PB according to the invention may be made smaller and thinner than conventional PB's.

The foil that is laminated to the thin resin film is a relatively thin sheet of essentially uniform thickness as characterized by ANSI/IPC-MF-150F, §3.4.3, adopted on Oct. 4, 1991, entitled: "Metal Foil for Printed Wiring Applications," published by the Institute for Interconnecting and Packaging Electronic Circuits, 7380 N. Lincoln Avenue, Lincolnwood, Ill. 60646. The foil may have a thickness between about 0.1 mil ($2.54 \times 10^{-4}$ cm) to about 20 mils ($5.08 \times 10^{-2}$ cm); varying ±10 percent for deposited foils and ±5 percent for wrought lofts. Suitable forms of the foil are of the electrodeposited or wrought forms. The foil sheet may be made of a variety of conductive metals and metal alloys, such as aluminum, copper, chromium, gold, silver, magnesium, nickel, brass, zinc, and the like. Preferred foil metals are aluminum, copper and nickel. Copper grade foils are characterized by ANSI/IPC-MF-150F, at §1.2.4.1 and such are included in the practice of the invention. The foil sheet may be a separately formed sheet that is adhesively bonded to the thin resin film or the foil may be formed as a sheet bonded to the thin resin film by a metal deposition technique. The metal deposition can be effected by electroless and electrolytic metal plating, by metal sputtering, vacuum deposition, and the like.

The metal foil can be precisionally debossed and the debossed foil can be placed in contact with the dielectric resin film. In the preferred embodiment, the male side of the foil sheet is contacted with a surface of the dielectric resin film. Then the foil is pressed with low pressure, but sufficient to impress the foil into a surface of the resin film. The thermosetting resin film has such flow characteristics that such impressing transmits the debossed and/or embossed pattern into the dielectric resin film. Surprisingly, the foil pattern is not collapsed by the pressure imposed on the foil. If the pattern comprises grooves, ridges and sockets suitable for making a PB, then that pattern is permanently fixed within the composite by curing the dielectric thermosetting resin film. The grooves, ridges and/or sockets can replicate a printed circuit pattern.

In order to achieve such results, the dielectric resin film component of the composition should have an unimpeded thickness that is at least equal to that of the foil penetrating the resin film and eventually bonded to it. Preferably, the dielectric resin film has an unimpeded thickness that is at least the thickness of the foil and as thick as 250 times the thickness of the foil. Preferably, the film has an unimpeded thickness that is at least about 1.2 times thicker to 25 times thicker than the thickness of the foil. Most preferably, the film has an unimpeded thickness that is at least about 2 to about 10 times thicker than the thickness of the foil. Typically, the thickness of the thin laminated composite comprising the foil and the unimpeded resin film is from about one (1) mil (0.00254 cm) to about two hundred fifty (250) mils (0.635 cm).

In the typical case, the unimpeded resin film thickness is at least equal to the depth of debossment of the metal foil into the resin film. An unimpeded resin film is an uncured, ungelled or un-near-gelled mass that contains no restrictions to the impressed metal foil. Such restrictions comprise continuous filament fiber as is found in a typical prepreg, fabric as is found in typical resin impregnated fabric (fabric pre-preg), paper as is found in a typical impregnated paper, and the like. However, cut fiber such as staple fiber, preferably having a length less than about 1.75 inches, has the ability to be moved in the film and, therefore, such is not construed to impede debossment of the resin film.

The cured conductive film composite can be used to create a PB or a tool for making PB. As such, it is appropriate to term the composite as a precursor to making a PB. In addition, the cured conductive film can be treated to remove metal foil from surface portions of the film that are not to be part of the electrical circuit of the PB. Consequently, the laminated foil precursor can be used to form a major part or all of the circuitry of the PB. One advantage of this invention is that PB's made this way can be made to be stackable and used in forming three dimensional PB's where the electrical connections between the stacked molded laminates may be through holes (PTH) extending through one or more layers of the stack and/or by connecting plastic tape circuits between the layers of the stack. This can be effected without some of the deficiencies noted above in respect to PTH problems in the prior art boards. Indeed, the molded pattern may include sockets (or cavities) or plateaus for chip components and trenches, furrows, grooves, channels or ridges between the sockets that are allocated for circuitry. In this form, the stacked PB's will exhibit the maximum compactness and hence allow for optimum miniaturization.

The conductive laminated cured film made according to the invention is useful as a female or male tool for making a PB by stamping another foil or film (with or without metal foil) having the same or similar composition.

The invention also contemplates the method of making a foil-laminated thin film of a thermosetting resin that contains in situ-expandable thermoplastic particles that contains an essentially uniform density and thickness across the breadth of the film. In this embodiment, pressure built up in the interior of the film during curing causes the film to expand. The invention contemplates placing such a foil-laminated film, made according to the procedure of the invention, and heating the film at a temperature that causes the in situ-expandable thermoplastic particles to expand from the foil. In such an embodiment, it is desirable to have the resin film surface out of contact with the foil, free to expand. In such an embodiment, the expansion is preferably carried out so that the surface of the film can expand to some extent without a confining surface.

The invention also contemplates laminating the aforedescribed metal foil-thermosetting resin laminate to a supporting layer comprising a thermoplastic polymer film, a fabric and/or a composite of a fabric and a thermoset or thermoplastic polymer impregnated fabric. The supporting layer is preferably bonded to the thermosetting resin layer of the laminate. Bonding is effected by relying on the adhesive qualities of the thermosetting resin layer. In making such laminates, the previously shaped metal foil debosses the thermosetting resin layer of the laminate or through the thermosetting resin layer into the supporting layer, in which case the metal foil is bonded to the supporting layer, typically by virtue of the adhesive qualities of the thermosetting resin layer of the laminate.

The invention of debossing thin metal foil followed by using the debossed foil to form a foil-thermosetting resin laminate where the laminate contains the debossed pattern of the foil, can be carried out in a batch, semicontinuous or continuous process. In a batch process, the foil is debossed with a stamp or other device, and then placed in contact with the resin film. The stamp can contain the tool with the desired surface mold containing the required grooves, ridges and chip and other device sockets and/or plateaus necessary for a PB. For example, the stamped foil may be superimposed on a resin film, the combination placed in a platen press. The press is used to lightly and gently force the debossed metal foil into the resin film thereby debossing the resin film and forming a composite. One or both platens may be heated to effect gelation or near gelation ("near-gel" state) of the resin film, thereby fixing the metal foil in the resin film. Neither platen need be heated so that debossment takes place under ambient conditions. In both cases, the debossed composite can be removed from the platen press and put in an oven to cure or post cure the resin and fix the debossed metal foil in the cured resin.

The semi-continuous process involves the pre-debossment of the metal foil followed by lamination to the resin film in a continuous mode to form scrolled rolls of the uncured composite. The uncured composite can be unscrolled, or the continuous formation mode can be accommodated with take up rolls, then cut into pieces. Gelation, near gelation or curing through heated platens or in an oven, as described above, takes place next. If desired, the debossed composite is removed from the press and subjected, as required, to oven treatment to cure or post cure the resin.

The continuous process involves the same prelamination step of the semicontinuous process. However, rather than batch cut the laminate, the laminate is fed continuously to a heated oven at a sufficiently high enough temperature to cause the composite's thermosetting resin to near gel, gel or cure, thereby fixing the debossment in the composite. The heated composite film can be fed directly to a continuous oven where the resin is cured or post cured, and then the film can be cut to isolate each debossed section that defines a printed board.

In respect to any of these procedures, there may be included a predebossment step in which the surface of the metal foil that is to contact the thermosetting resin film, or the thermosetting resin film, has printed on it a release agent coating that replicates the printed circuit pattern which is to be debossed into the foil-resin composite. The printing avoids coating those sections of the pattern that will constitute debossed/embossed portions of the pattern. The remainder of the pattern contains the coated release agent. The printing may be effected by a release agent deposition step effected by transferring release agent from 1. transfer sheets, typically thermoplastic film or release paper, to the metal foil film, or
2. through screens such as by silk screens, to the metal foil film, or
3. rotogravure rolls, to the metal foil film.

The transfer sheets can be formed by rotogravuring the release agent to the transfer sheet. The silk screening process can be effected using flat or rotary screens, as desired. Coating of the resin film surface with a release agent coating is used when the metal deposition on the film is by electroless or electrolytic plating.

The thermosetting resin film used in forming the laminate of the invention has the following qualities:
a) it will shape by processes such as stamping and compression molding, and the like;
b) the resin is nonconductive, which means that the resin can be used as a dielectric substrate;
c) it is a thin film that is sufficiently uniform in thickness in order to provide consistent heat shaping capability across the breadth of the film, and the thickness should be sufficient to accept the shape imposed by the shaping process;
d) the resin can be molded by compression or stamp molding without the need for constraining flow at the edges of the resin film;
e) the film possesses low flow over a broad temperature range so that it does not flow uncontrollably while undergoing cure conditions, and when placed under pressure, only the portions that are superimposed over a groove or cavity in the case of a female mold, or over a protuberance in the case of a male mold, will be caused to flow because of pressure imposed on the film; and
f) the film gels or achieves properties similar to a state of gelation ("near-gel" state), over conditions leading to cure, that satisfy commercial conditions.

The resin formulation may contain a number of additives that aid in the performance of the resin in forming a dielectric substrate onto which metal foil is deposited. One such additive is a low profile additive. Low profile additives are thermoplastic polymers that have the capacity to cause the cured thermoset resin to avoid shrinkage at the foil resin interface. In fact, low profile additives can serve to slightly expand the surface of the resin so that at the time the foil-resin laminate is undergoing advancement toward resin cure, the low profile additive causes the resin film to slightly expand up to about 2–3%, preferably up to about 1–2%, and this assures that the debossed portions of the printed board pattern are smooth, uniform and devoid, or essentially devoid, of shrinkage. This is particularly advantageous if the metal foil is formed by a deposition process such as electroless and/or electrolytic plating.

The thin, essentially-nonconductive, thermosetting resin film that is adhered to the foil is, when made independent of the metal foil, moldable without edge flow constraints, and contains, as its major ingredients,
(i) a thermosetting resin that advances in molecular weight without forming a significant volatile byproduct and
(ii) a flow control component.

The resin film possesses—
a) an uniform areal thickness ranging from about 1 to about 250 rafts (about 0.00254 cm to about 0.635 cm) as calculated from the weight of resin film for a given area;
b) with minimum and maximum thicknesses not exceeding the deviation factor set forth in Table A.

TABLE A

| Range in mils | Deviation Factor |
|---|---|
| 1 to 5 | ±1 mil (±0.00254 cm) |
| 5 to 10 | ±2 mils (±0.00508 cm) |
| 10 to 250 | ±20% | c) low flow at a broad temperature range;
d) the ability to cure, gel, or near-gel, at temperatures from about 20° C. to about 250° C., in less than about 7 days and more than 1 second;
e) a low dielectric constant in the thermoset state.

The laminated composite of the foil sheet and the thermosetting resin film have essentially the same surface area.

In a further embodiment of the invention, the moldable, essentially nonconductive thermosetting resin film employs as the flow control agent a diverse group of materials, such as:
i) one or more electronic grade fillers;
ii) a thermoplastic resin that is soluble or partially soluble in the thermosetting resin;
iii) an elastomer-type polymer that provide discrete elastomer phases (second phases) in the thermosetting resin matrix;
iv) a thixotrope; and
v) a mixture of two or more of i), ii), iii) and iv).

DETAILED DESCRIPTION OF THE INVENTION

Figure 1A:
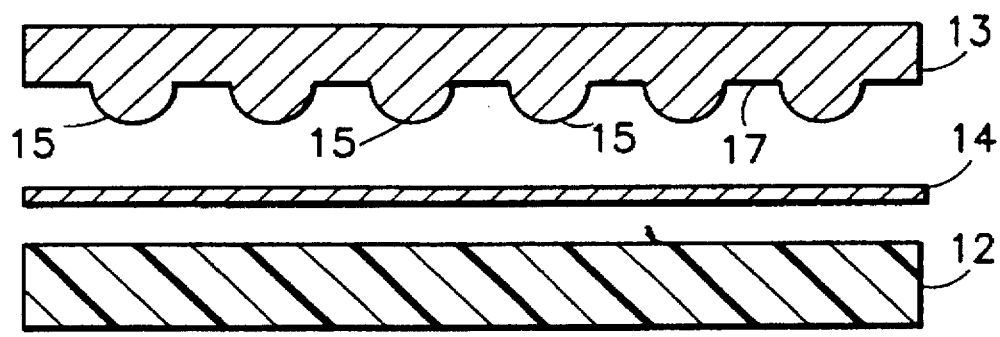
FIG. 1A schematically illustrates a side view, in a partially depicted exploded relationship, of a batch process for press stamping the foil over a resilient supporting layer.

The process of the invention creates the initial stage of forming the electrical circuit in a PB by a mechanical pressing action that either debosses or embosses the circuit path on foil and the foil is impressed into a thin film of thermosetting resin adhesive. A master tool has the circuit pattern on it as raised lines (embossed) or depressed groves (debossed). A master tool has the circuit pattern on it as raised lines (embossed) or depressed groves (debossed). The master tool is made by a conventional photo imaged chemical etch process. A metal tool plate is covered with a photoresist. U.V. light is shined through a negative image of the embossed circuit paths, onto the photoresist, hardening the areas that will remain after etching. The piece is then treated to remove the unhardened areas of photoresist of the photoresist. When passed through an acid bath (e.g., ferric chloride solution), the exposed metal of the tool plate is etched away. The hardened areas of photoresist of the photoresist are stripped off leaving a relief image of the embossed pattern to be stamped into the loft.

Illustrative of the method of the invention:

1. The raised line (embossed) tool is pressed into copper (or other metal) foil to impress the electrical circuit in the debossed foil. Then the foil, separated from the tool, is placed adjacent the adhesive. They can be pressed together in seconds and cured in a later operation. A PB can be formed by mechanically abrading foil from the raised portion of the laminate. The debossed portions of the laminate contain the electrical line tracings.

2. That method may be modified by masking the circuit line pattern on a silk screen or stencil, and coating the underside of the copper foil, i.e., the side of the foil that contacts the adhesive, with a release agent. After the foil is debossed and pressed together with the adhesive, and the adhesive is cured, then the foil over the release agent can be abraded to easily separate those sections of the loft from the laminate.

The concept of molding a non-conducting thermosetting resin in order to form a PB requires a thermosetting resin having the properties set forth above. Very few thermosetting resin formulations have the capacity to form a thin film possessing the following collective properties:

a) the formulation shapes by processes such as stamping, compression molding, shaping by impressing with a foil sheet, and the like;

b) the resin formulation is nonconductive, which means that the formulation can be used as a dielectric substrate;

c) the formulation forms a thin film that is sufficiently uniform in thickness in order to provide consistent heat shaping capability across the breadth of the film, and the thickness should be sufficient to accept the shape imposed by the shaping process;

d) the formulation can be molded by compression or stamp molding with a debossed foil without the need for constraining flow at the edges of the resin film;

e) the resulting film possesses low flow over a broad temperature range so that it does not flow uncontrollably while undergoing cure conditions, and when placed under pressure, only the portions that are superimposed over a groove or cavity in the case of a female (debossed) foil mold, or over a protuberance in the case of a male (embossed) foil mold, will be caused to flow because of pressure imposed on the film; and f) the resulting film gels or achieves properties similar to a state of gelation, over conditions leading to cure, that satisfy commercial conditions.

The average thickness is preferably from about 1 to about 250 mils (about 0.00254 cm to about 0.635 cm).

The invention relates also to the use of a thin isotropic thermosetting resin film with the metal foil layer that is amenable to being subjected to the debossing procedure that imparts a printed circuit pattern thereon. These thin isotropic thermosetting resin films avoid the aforementioned CTE deficiencies of an anisotropic fabric prepreg. This can be effected with minimal loss of debossment precision for eventually generating a printed circuit board that is devoid of CTE mismatch, or for forming a tool useful in effecting the debossment procedure. The thin isotropic thermosetting resin film/foil laminate has the capacity of being precision molded as herein defined at a relatively low temperature, such as temperatures as low as room temperature (~23.5° C.), with superior duplication of the pattern.

The invention also contemplates associating with the foil layer, a thin isotropic film of a thermosetting resin that contains in situ-expandable thermoplastic particles that contains an essentially uniform density and thickness across the breadth of the film. In this embodiment, pressure built up in the interior of the film during curing causes the film to expand. The invention contemplates placing such a film in contact with a debossing stamp containing a replicative printed circuit pattern and heating the film at a temperature that causes the in situ-expandable thermoplastic particles to expand into the debossing stamp surface to generate a debossed pattern in the expanded film.

The term "isotropic" means, in the context of this invention, a material possessing essentially the same electrical and physical properties in all directions (e.g., x, y and z) through it. This is to be contrasted with fabric reinforced prepregs. Such prepregs are anisotropic. They exhibit several times differences in properties between the x, y and z directions. In the case of this invention, the films do not exhibit differences in electrical and physical properties by more than 20% in any direction.

There are many commercial thermosetting resin systems that can be used to produce a thin pliable adhesive thermosetting resin film. For example, certain of such films are employed in Synspand® and Syncore®, expanded or expandable films that are sold by The Dexter Corporation. However, another special subset of such a resin system is a thin thermosetting resin film that is amenable to being subjected to a debossing procedure that imprints a printed circuit pattern thereon. Such a resin film should be capable of effecting debossment precision when debossed by a debossed metal foil film, sufficient to eventually generate a PB or for forming a tool useful in effecting the debossment procedure leading to the PB. The thin thermosetting resin film should have the capacity of being precision debossed, e.g., stamped, with a debossed metal foil at a relatively low temperature, such as temperatures as low as room temperature (~23.5° C.), with superior duplication of the printed circuit pattern in the foil surface that is transferred to the resin film bonded to the foil. It is particularly desirable that the resultant thin metal foil thermosetting resin film laminate exhibit a grooved printed circuit pattern thereon with minimal loss of debossment precision of the grooved pattern. The thin metal foil thermosetting resin film laminate should be capable of retaining the debossed pattern of the debossed foil and the grooving through a cure cycle without flow out within the pattern, to produce a thermoset (i.e., cured) resin film laminated to the foil, that is employable for making a printed board. In this embodiment, stamping is conducted in the metal foil surface. The thin metal foil thermosetting resin film laminate may be subsequently compression molded to refine or alter the debossed pattern introduced by pressing a debossed foil and a thin resin film, by using match metal mold dies and while subsequently debossing the foil side of the laminate with the male die, the resin side of the mold can be embossed by the other die.

On the other hand, the thin thermosetting resin film may be subjected to flow into the grooves and cavities of a female debossed metal foil, as defined above, to form a male replication of the female foil, or shaped and stamped by debossment with a male foil sheet, subjecting the resin to temperatures sufficiently high enough to set the resin (e.g., by gellation, incipient gellation or cure) while in contact with the foil, thereby fixing a surface thereof to replicate the male or female image of the female or male surface, as the case may be. In this manner, the laminate of the invention is convertible into a male or female tool for making a PB by debossing another foil or resin film having the same or similar composition or the film can be used as a PB substrate.

The element of the essentially nonconductive thermosetting resin film is that it is shapable. It has a thin uniform thickness. It contains a thermosetting resin that advances to a cured state without forming a significant volatile byproduct that will affect the quality of the cured film. It contains one or more flow control components that allows the film to be molded without flow constraints, provides low flow of the film over a broad temperature range and retains a debossed image during debossment up to and through cure of the film. The film advances, under conditions leading to cure of the thermosetting resin, to a state of gelation (see 650 Methods 2, 3, 18) or a condition that gives physical properties similar to the state of gelation (i.e., incipient gelation) at temperatures as low as about 20° C. to about 250° C., in less than about 7 days and more than 1 second. Such setting conditions allow the bossed film to be handled, either by hand or mechanically, whereby the debossed film can be fully cured or subjected to gelation. Last but not least, the film exhibits a low dielectric constant (i.e., possesses the ability to resist the formation of an electric field within it) consistent with the requirements of a PB.

In another embodiment of the invention, the moldable, essentially nonconductive thermosetting resin film is metal platable and adheres to a conductive metal film. In particular, the film is metal platable and adhesively bondable to metal foil that can be used in the making of a stamping surface or for creating a conductive pathway on the debossed and cured resin film.

The Thermosetting Resin

The typical thermosetting resin is an A-stage resin. In some cases, it may be desirable to utilize a B-stage resin but in the typical case, such is done in combination with an A-stage resin. Such B-stage resin will affect the viscosity of the resin formulation but they are typically not relied on to achieve the level of thickening for the most effective operation of the invention.

Epoxy systems curing in the range from 150°–400° F. (65.5°–204.4° C.) are common matrix resins for making thin film thermosetting resin products including the products of this invention. Matrix resin of bismaleimide (BMI), phenolic, polyester, PMR-15 polyimide, cyanate ester resins and acetylene terminated resins may also be used. The most widely used matrix resins are the epoxy resins, and a wide variety are suitable for use in the practice of this invention. Illustrative of such epoxy resins are the following:

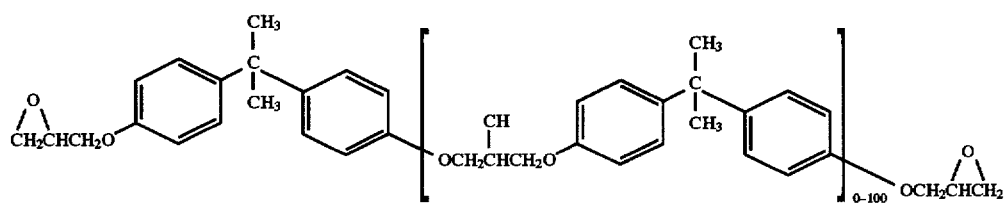

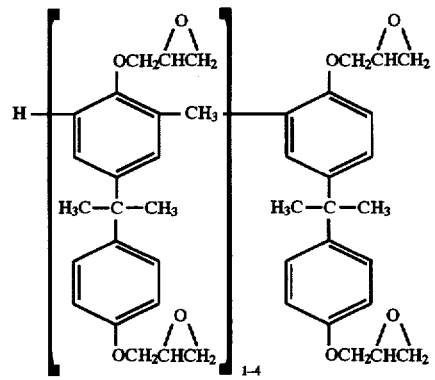

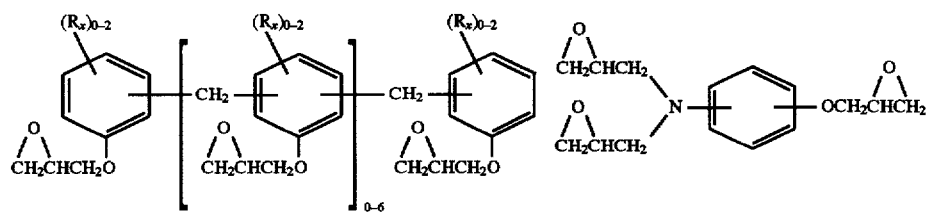

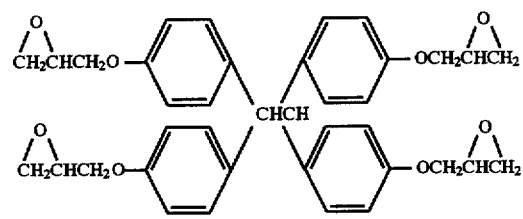
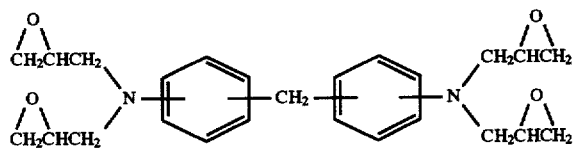
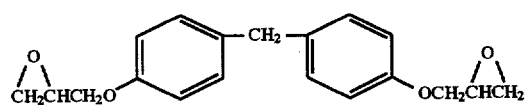
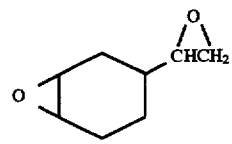
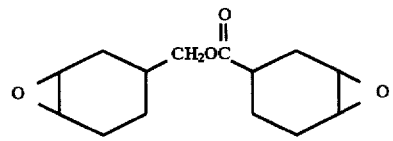
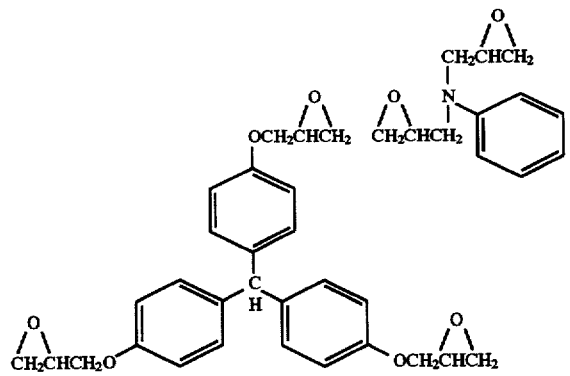
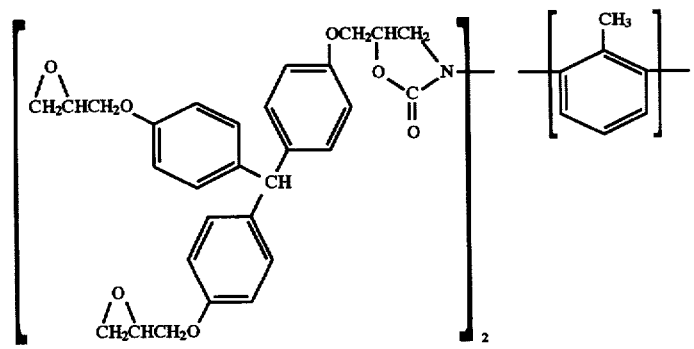

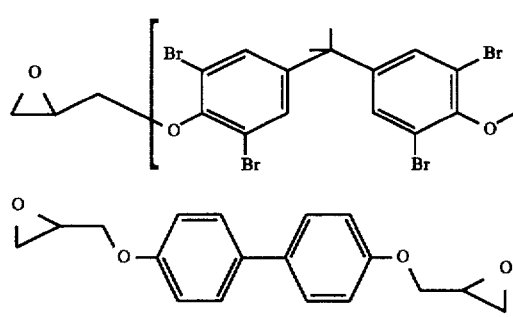

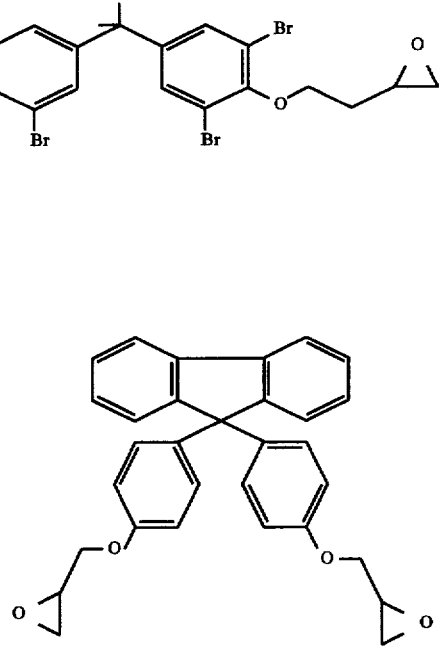

The epoxy resins may be modified up to 95 weight percent by including in the resin formulation bis-aryl cyanate esters, such as those of the formula:

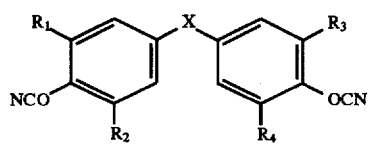

wherein X is a bisphenol linkage and $R_{1,2,3\ and\ 4}$ are ring substituents such as hydrogen, alkyl, aryl, and the like. Illustrative compounds are:

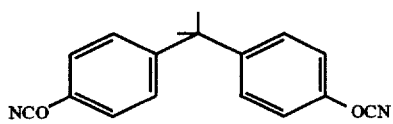

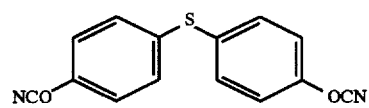

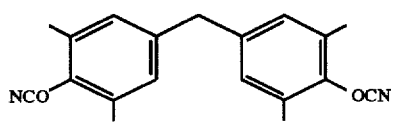

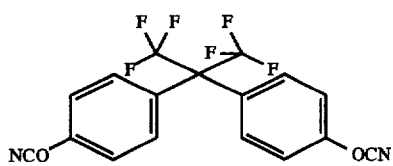

-continued

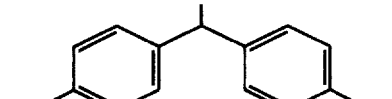

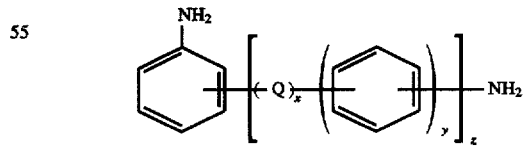

Another preferred resin is one that is totally the reaction product of one or more of the bis-aryl cyanate esters.

Catalysts and Hardeners

The epoxy resin systems contain epoxy curing agents to form solid, infusible products. For this purpose, epoxy curing agents that are acidic, neutral or alkaline may be used. Examples include, among others, amines hardeners, phenols, acid anhydrides, polyamides and Lewis acids and bases. Desirably, the epoxy resins of the invention are combined with hardeners that cure the resin to a thermoset condition. The preferred hardeners are amine compounds, ranging from dicyandiamide, to ureas, to aliphatic and aromatic amines. Preferred are the aromatic amines encompassed by the formula:

wherein Q is one or more of a divalent group such as $-SO_2-$, $-O-$, $-R_aR_bC-$, $-NH-$, $CO-$, $-CONH-$, $-OCONH-$, and the like, Ra and Rb may each independently be one or more of hydrogen, phenyl, alkyl of 1 to about 4 carbon atoms, alkenyl of 2 to about 4 carbon atoms, fluorine, cycloalkyl of 3 to about 8 carbon atoms, and the like, x may be 0 or 1, y may be 0 or 1 and is 1 when x is 1, and z may be 0 or a positive integer, typically not greater than about 5.

Another preferred class of hardeners are the aliphatic amines such as the alkyleneamines. Illustrative of suitable alkyleneamines are the following: monoethanolamine, ethylenediamine, N-(2-aminoethyl)ethanolamine, diethylenetriamine, piperazine, N-(2-aminoethyl) piperazine, triethylenetetramine, tetraethylenepentamine, pentaethylenehexamine, diaminoethylpiperazine, piperazinoethylethylenediamine, 4-aminoethyltriethylenetetramine, tetraethylenepentamine, aminoethylpiperazinoethylethylenediamine, piperazinoethyldiethylenetriamine, and the like.

Another class of hardeners, which can also be used as extender of the epoxy resin, are the higher molecular weight poly(oxyalkylene)polyamines such as those of the following formulas:

where v is 2–40

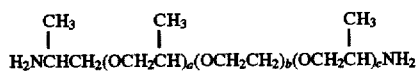

where a + c is about 2
and b is 8–45.

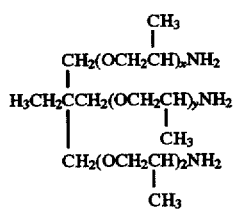

where x, y and z range from 2–40

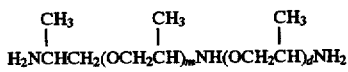

where m + d is about 82–86.

Preferred hardeners are diamines of the formula:

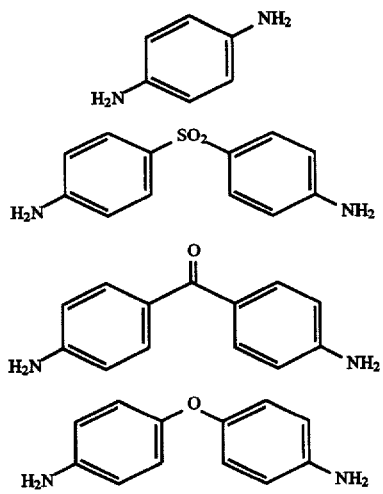

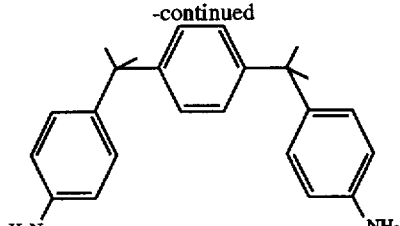

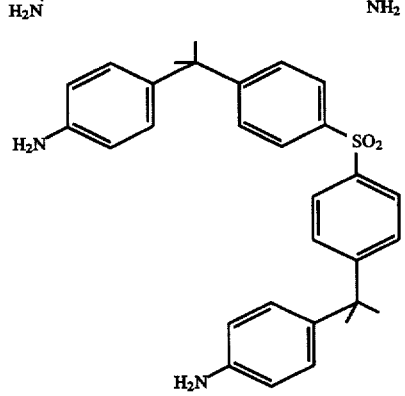

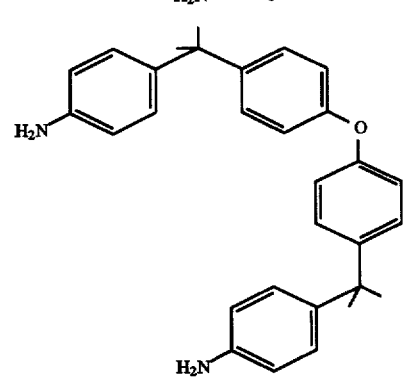

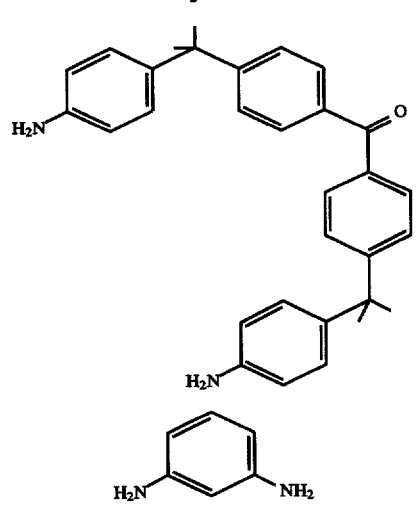

The hardener may be a monoamine such as aniline, para-aminophenol, and alkylated versions of them. Other desirable hardeners are the reaction products of dialkylamines, such as dimethylamine, diethylamine, methylethylamine, di-n-propylamine, and the like, with a variety of mono and diisocyanates to form mono and diureas. Any of the polyisocyanates listed below may be so reacted for use as a hardener. Specific illustration of useful hardeners are those encompassed by the following formulas and descriptions:

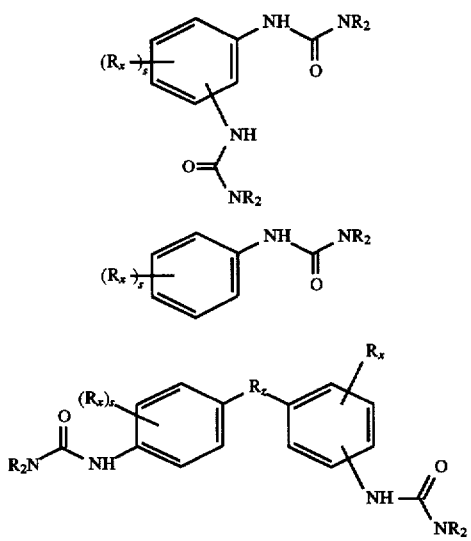

wherein $R_y$ is a monovalent group; $R_x$ is alkyl, halo, alkoxy, and the like; $R_z$ is methylene, isopropylidene, ethylidene, or a covalent bond; and s is 0–4.

Preferred urea hardeners are those that are the reaction products of dimethylamine with mixtures of 80% 2,4-tolylene diisocyanate and 20% 2,6-tolylene diisocyanate, polymeric isocyanate, p-chlorophenylisocyanate, 3,4-dichlorophenyl-isocyanate or phenylisocyanate.

Accelerators may also be used and include imidazoles and substituted ureas. Examples include 2-ethyl-4-methylimidazole and p-chlorophenyl-1,1-dimethyl urea.

The amount of the hardener employed is usually stoichiometric on the basis of one amine group per epoxy group in the resin. If the epoxide is a triepoxide and the hardener is a dialamine, then the molar ratio of hardener to epoxide would typically be about 2.5/3 or 0.83. A typical formulation would have a weight ratio of epoxy resin to hardener of about 3/2 to about 4/1. Where any of the hardeners serve primarily as extenders of the epoxide resin, then the amount of the hardener in the typical case will be less than that generally employed for hardening the epoxide. Mixtures of the above hardeners and with other hardeners are within the contemplation of this invention.

Other Useful Resins

As noted above, other reactive resin systems include the various thermosetting or thermosetting resins include the bismaleimide (BMI), phenolic, polyester (especially the unsaturated polyester resins typically used in SMC production), PMR-15 polyimide, bis-aryl cyanate esters and acetylene terminated resins are also suitable.

A particularly desirable resin for this application is the vinyl ester resin. This class of resin is based on the reaction of unsaturated carboxylic acids and epoxy resins or epoxy compounds. Illustrative reactants in forming the vinyl esters are the following:

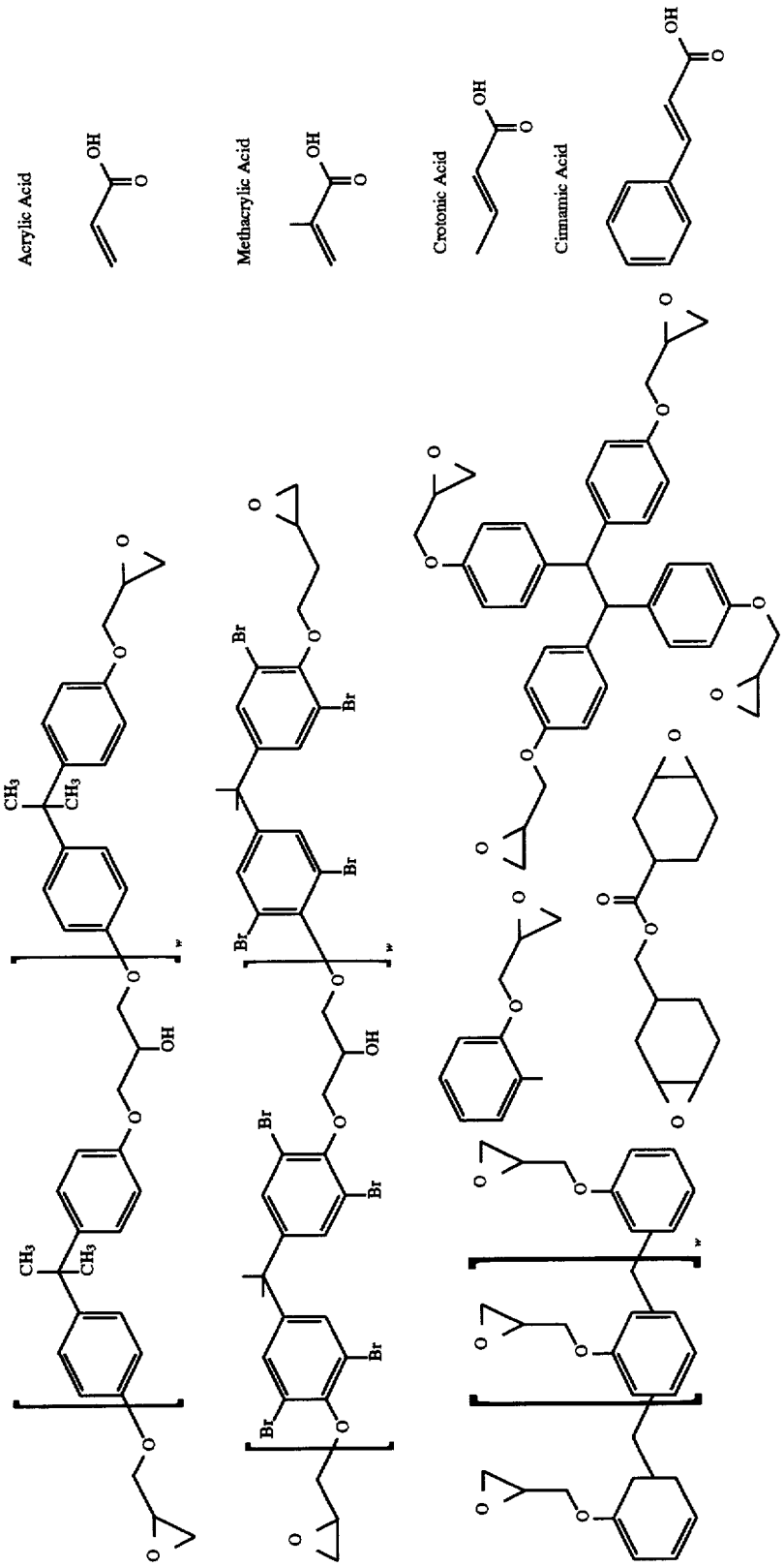

Typical of the vinyl esters are the following:

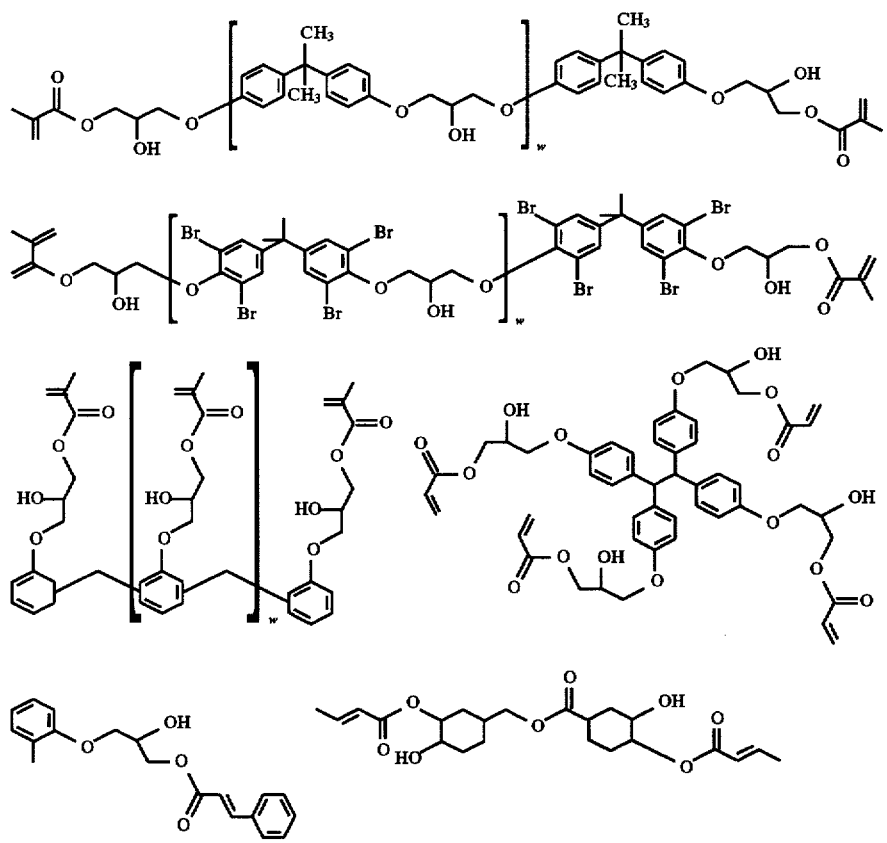

In the above formulae, w is a positive value of from about 1 to about 20, preferably from about 2 to about 10.

The vinyl ester resins may be used alone or in combination with monoethylenically unsaturated monomers, such as styrene, o-methylstyrene, m-methylstyrene, p-methylstyrene, ethylstyrene, α-vinyl-xylene, α-chlorostyrene, α-bromostyrene, vinylbenzylchloride, p-tert.-butylstyrene, methyl methacrylate, ethyl acrylate, propyl acrylate, butyl acrylate, butyl methacrylate, propyl methacrylate, butyl methacrylate, lauryl acrylate, 2-ethyl hexyl acrylate, ethyl methacrylate, and the like.

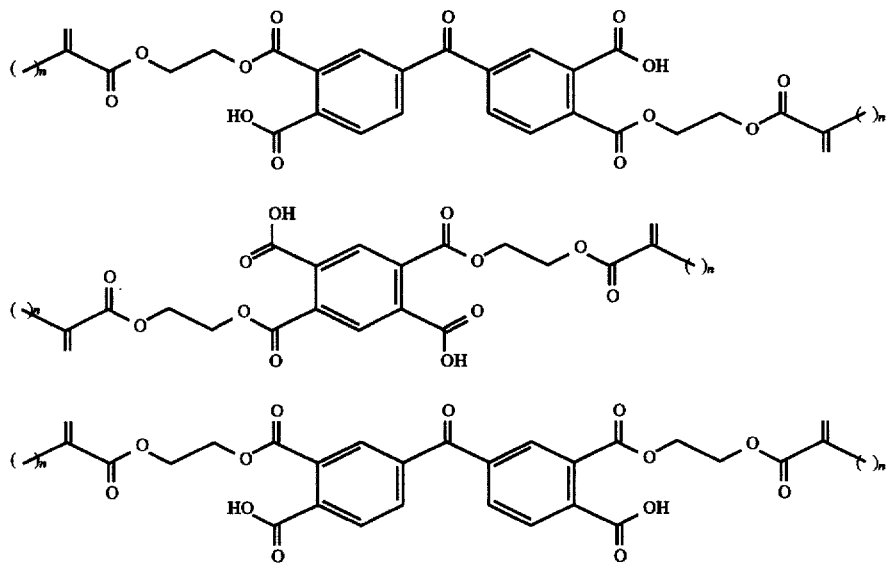

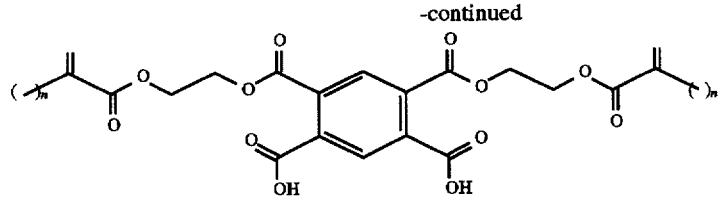
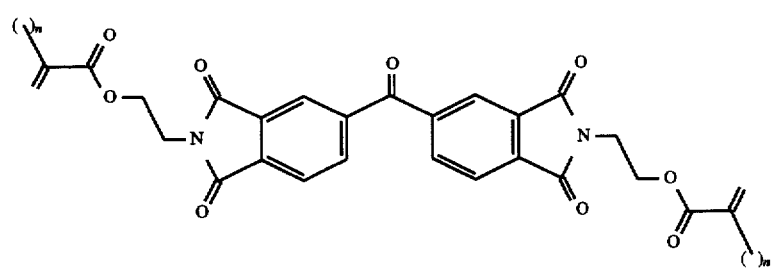
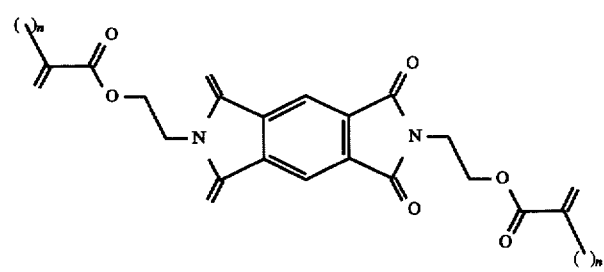
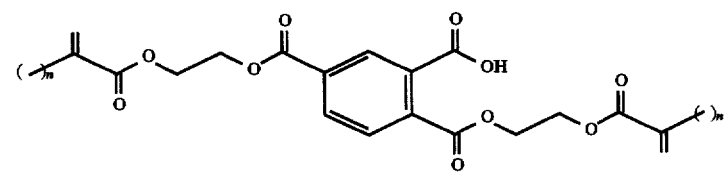
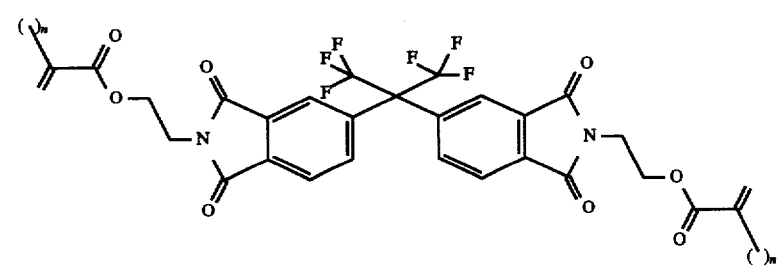
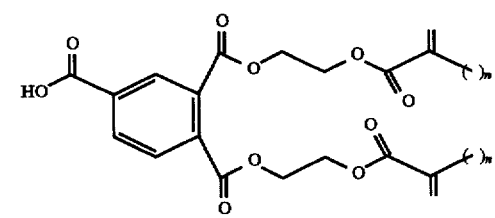
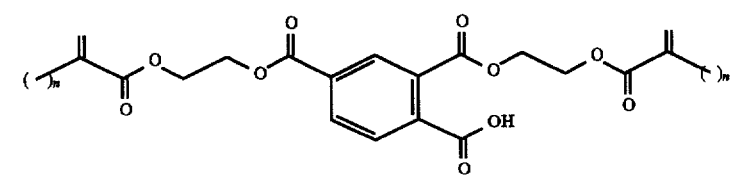

-continued

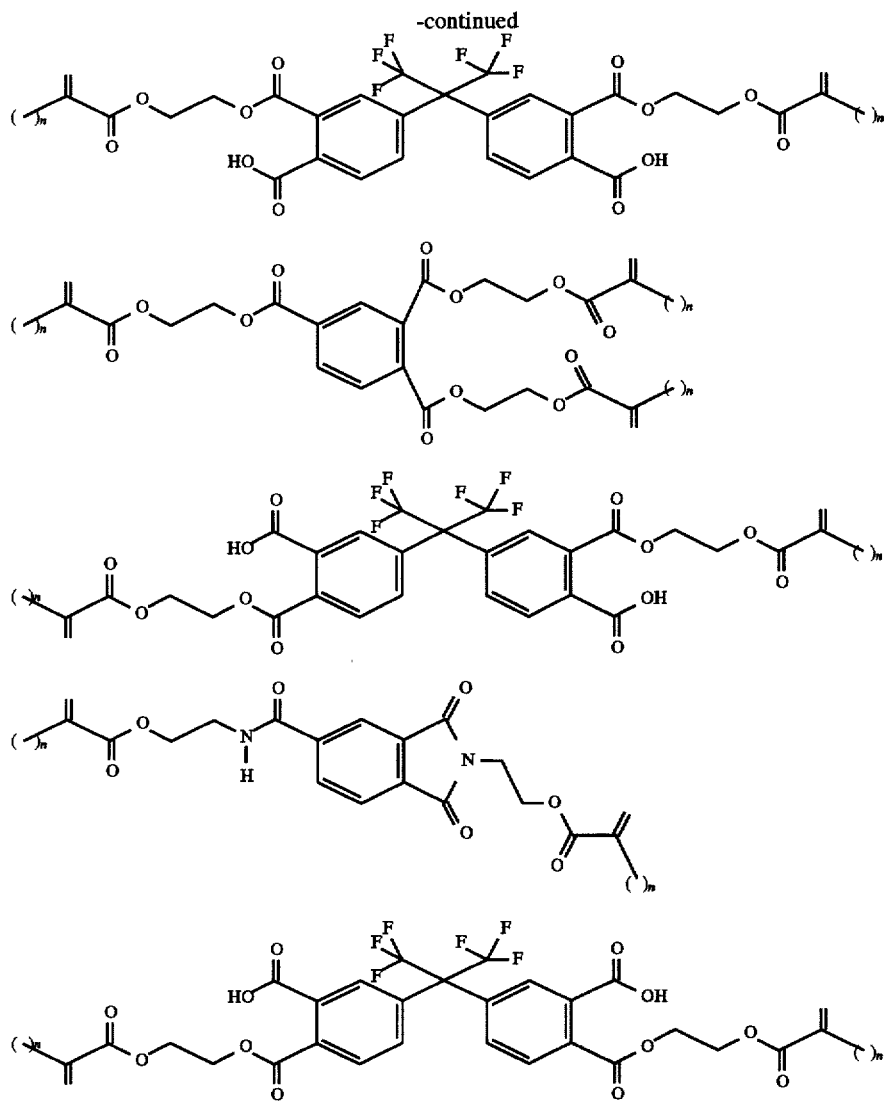

diethylene glycol dimethacrylate, 1,4-divinylbenzene, and the like. In the above, n is 0 or 1.

A number of vinyl ester resins require the use of solvents such as methyl ethyl ketone, acetone, toluene, and the like.

The vinyl esters may be cured by any free radical mechanism, such as by photoinitiation and/or by use of peroxidic compounds. A photoinitiator may be included in the formulation, as an optional ingredient. Light-initiated curing of the vinyl ester alone or with other polymerizable materials involves photosensitization of light-sensitive compounds by ultraviolet or visible light, which, in turn, initiates polymerization of the resin materials. The photoinitiator may comprise a combination of a photosensitive ketone and a tertiary amine. Typical photosensitive ketones include benzophenone, acetophenone, thioxanthen-9-one, 9-fluorenone, anthraquinone, 4'-methoxyacetophenone, diethoxyacetophenone, biacetyl, 2,3-pentadione, benzyl, 4,4'-methoxybenzil, 4,4'-oxidibenzil, and 2,3-bornadione (dl camphroquinone). Typical tertiary amines include ethyl-4-dimethyl amino benzoate, ethyl-2-dimethyl amino benzoate, 4,4'-bis(dimethylamino) benzophenone, N-methyldiethanolamine, and dimethylaminobenzaldehyde. Any of the known photosensitizing system that can function effectively when exposed to light may substitute for the above-named compounds or combinations. The amount of the photoinitiator should be sufficient to initiate polymerization in a selected resin and complete it in depth within about half a minute when the resin composition is exposed to a visible-light output of at least 5,000 foot candles. In addition, any known free-radical scavenger (anti-oxidants) such as butylated hydroxytoluene can be used to scavenge small amounts of free radicals generated during extended shelf storage.

The curing of the vinyl ester is primarily effected by a thermal initiator, which is a typical thermal curing agent known in the art. Illustrative of these are benzoyl peroxide, dicumyl peroxide, methyl ethyl ketone peroxide, ditertiary butyl peroxide, tertiary butyl hydroperoxide, tertiary butyl perbenzoate, Luperox 118 (sold by Wallace and Tiernan, Lucidol Division, 1740 Military Road, Buffalo, N.Y. 14240), cumene hydroperoxide, or other suitable peroxides may initiate polymerization of the polymerizable ethylenically unsaturated components of the primary coating. For example, Benzoyl peroxide may be used together with 2-hydroxyethyl-p-toluidine. It is common to combine metal salts such as metal naphthenates, e.g., cobalt naphthenate, and the like, with tertiary amines, such as dimethyl aniline, with the peroxidic catalyst.

The amount of catalyst is typically that amount that facilitates the cure within less than ten hours at a temperature greater than 25° C. Generally, the catalyst system will be less than about 10 weight percent of the resin formulation. As a

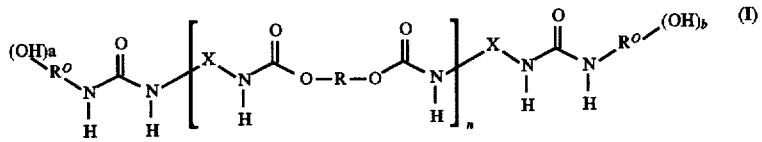

rule, the catalyst system will range from about 0.1 to about 8 weight percent of the resin formulation.

Thickening

As noted above, thickening of the resin in forming the film involves the combination in the resin formulation of—
i) one or more electronic grade filler;
ii) a thermoplastic resin that is soluble or partially soluble in the thermosetting resin;
iii) an elastomer-type polymer that provide discrete elastomer phases (second phases) in the thermosetting resin matrix;
iv) a thixotrope; and
v) a mixture of two or more of i), ii), iii) and iv).

Illustrative of suitable electronic grade fillers are aluminum oxides including alumina trihydrate, coated aluminum nitrate, silicon carbide, diamond, ground cured fiber reinforced thermoset resin, as well as a variety of thermoplastic and thermosetting fibers. The thermoplastic polymer used in forming these fibers may be made from condensation type polymers, such as nylon-6,6; nylon-6; nylon-4,6; polyester from polyethylene terephthalate; Kevlar™ polyaramide; polycarbonates (viz., poly (2,2-his (1,4-oxyphenyl) propane carbonate)); polyarylates (viz., poly (2,2-bis(1.4-oxyphenyl) propane terephthalate); polyimides; polyetherimides, such as Ultem™[1]; polysulfones (see U.S. Pat. Nos. 4,175,175 and 4,108,837), such as Udel™ and Radel™ A-400[2]; the polyethersulfones (see U.S. Pat. Nos. 4,008,203, 4,175,175 and 4,108,837), such as Victrex™[3]; polyarylsulfones; polyarylamideimides, such as Torlon™[4]; and the acrylics and modacrylic fibers; and the like. The thermoplastic polymer used in providing the thermoplastic polymer may also be made from condensation the polymers used in forming the film, such as nylon-6,6; nylon-6; nylon-4,6; polyester from polyethylene terephthalate; Kevlar™ polyaramide; polycarbonates (viz., poly (2,2-bis (1.4-oxyphenyl) propane carbonate)); polyarylates (viz., poly (2,2-bis(1.4-oxyphenyl) propane terephthalate); polyimides; polyetherimides, such as Ultem™; polysulfones (see U.S. Pat. No. 4,175,175 and 4,108,837), such as Udel™ and Radel™ A400; the polyethersulfones (see U.S. Pat. Nos. 4,008,203, 4,175,175 and 4,108,837), such as Victrex™; polyarylsulfones; polyarylamideimides, such as Torlon™; and the like.

A particularly preferred class of thermoplastic polymer for providing toughening and as a flow control aid for the thermosetting resin formulations are the polyurethanes of the formula:

[1] Available from General Electric Company, Plastics Business Group, Pittsfield, Ma.
[2] Manufactured by Amoco Performance Products Inc.
[3] Available from ICI Advanced Materials, Wilmington, Del. 19897
[4] Available from Amoco Chemical Company, Chicago, Ill.

wherein a and 5 are each 1, 2 or 3, n is at least 1, X is a divalent organic radical containing at least two carbon atoms in which the N's are bonded to different carbon atoms of X, R is an aliphatic polyester or polyalkylene oxide wherein
the aliphatic polyester is a polyester of an alkylene diol and an aliphatic carboxylic acid, or a polycaprolactone polyol, and
the alkylene group of the polyalkylene oxide contains on average greater than three carbon atoms and not greater than five carbon atoms, and
R° is an organic aromatic containing group in which the OH and N bonded to the R° group is bonded directly to different aromatic carbon atoms. Synergistic combinations of the polymer of formula (I) and other toughener polymers are useful in improving the toughening properties of the thermosetting resin formulations for making printed circuit board composites.

This invention includes the use in the thin film thermosetting resin formulation of a miscible or partially miscible linear polyurethane polymer containing phenolic hydroxyl functionality for reaction with a thermosetting resin comprising
a linear polyurethane of recurring units containing linear ester or ether moieties or a combination of ester and ether moieties
which are interbonded through urethane groups and
uriedo bonded phenolic hydroxyl-containing terminal groups.

These linear polyurethane toughener polymers may contain uriedo bonded phenolic hydroxyl-containing terminal groups of the formula:

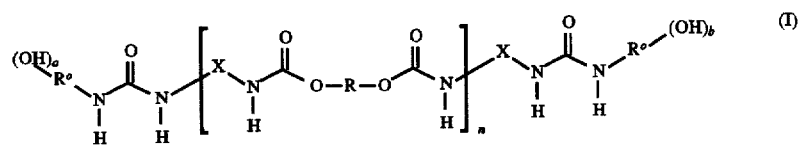

wherein a and b are each 1, 2 or 3, n is at least 1, each X is a divalent organic radical containing at least two carbon atoms in which the N's are bonded to different carbon atoms of X, R is an aliphatic polyester or polyalkylene oxide wherein
the aliphatic polyester is a polyester of an alkylene diol and an aliphatic carboxylic acid, or a polycaprolactone polyol, and
the alkylene group of the polyalkylene oxide contains on average greater than three carbon atoms and not greater than five carbon atoms, and
R° is an organic aromatic containing group in which the OH and N bonded to the R° group are bonded directly to different carbon atoms and the OH is bonded directly to an aromatic carbon atom. An improved version of the polymer of formula (I) is the polymer of formula (II).

A preferred polyurethane is one having a molecular weight from about 20,000 to about 120,000, preferably about 30,000 to about 110,000, and most preferably about

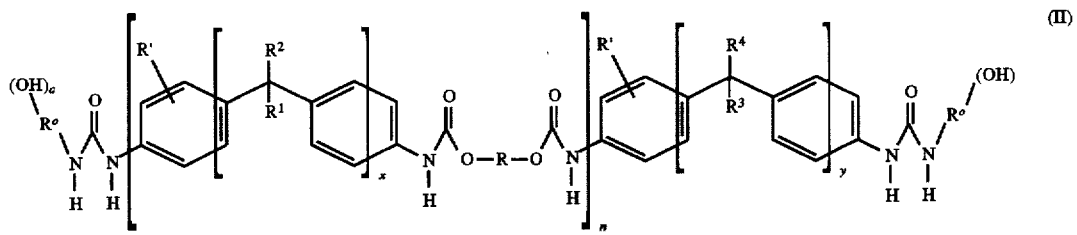

(II)

wherein x and y are 0 or 1, R' is hydrogen or alkyl of 1 to about 3 carbon atoms, and $R^1$, $R^2$, $R^3$ and $R^4$ are hydrogen, nitro, halogen or alkyl of 1 to about 4 carbon atoms. In a preferred embodiment of formula (I), the carbons to which the OH and N are bonded are separated from each other by at least one aromatic carbon atom. A more desirable embodiment is a toughener polymer of the formula:

85,000 to about 100,000, formed by the reaction of a poly-1,4-butylene oxide diol having a molecular weight of from about 650 to about 5,000 with a stoichiometric excess of methylene diphenyldiisocyanate capped by reaction with o, m or p-amino phenol.

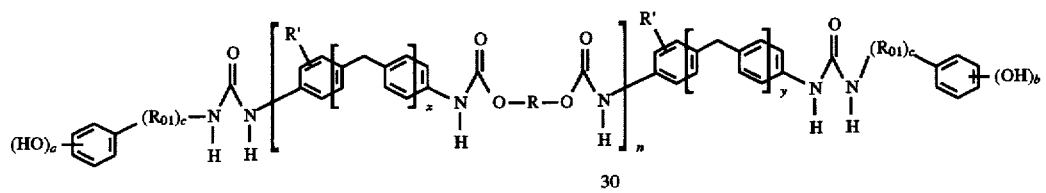

(III)

In this embodiment, $R_{01}$ is a divalent organic group and c is 0 or 1. In a preferred embodiment of the invention, with respect to the polymer of formula (II), x and y are each 1, $R^1$, $R^2$, $R^3$ and $R^4$ are hydrogen, a and b are 1 and n has a value such that the weight average molecular weight of the polymer is about 20,000 to about 120,000. Incorporating this preferred embodiment in formula (III), $R_{01}$ is methylene or c is 0. In a further preferred embodiment is a polymer having the formula:

The polyurethane polymer suitable for use in the thermosetting resin film formulation can be a modification such as those made by the following reactions:

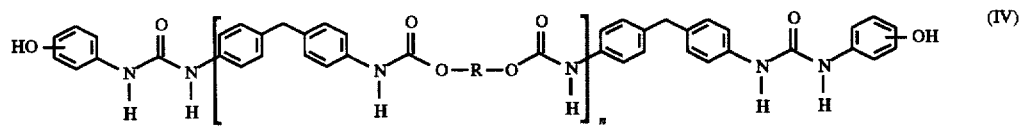

(IV)

wherein n has a value such that the weight average molecular weight of the polymer is about 30,000 to about 110,000 and R is a polyalkylene oxide in which the alkylene groups thereof have an average value of about 3.5 to about 4.5 carbon atoms. A most preferred polyurethane polymer has the formula:

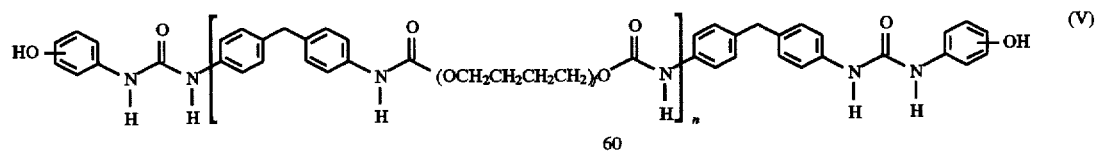

(V)

wherein n has a value such that the weight average molecular weight of the polymer is about 85,000 to about 100,000 and f has a value of at least 1, preferably from 1 to about 70, more preferably form about 4 to about 55, and most preferably from about 6 to about 42. The terminal hydroxyl groups may be in the ortho, meta or para positions, preferably in the para position.

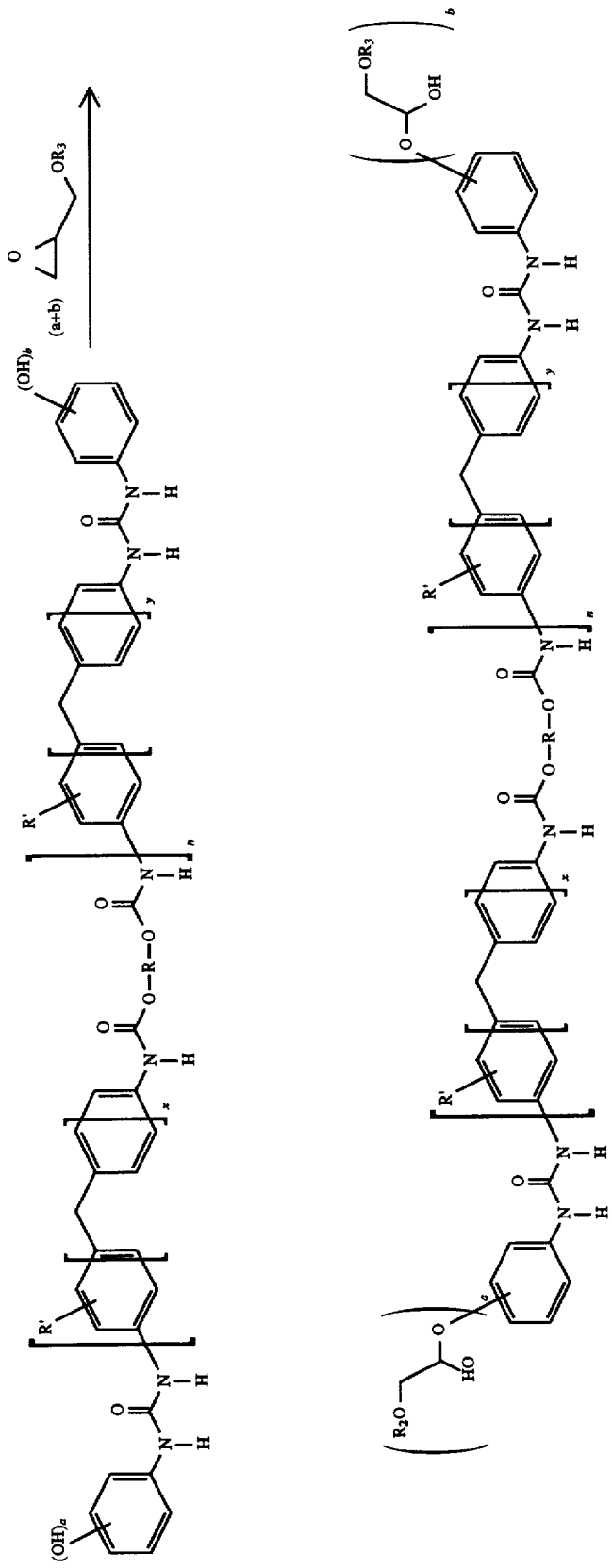
or

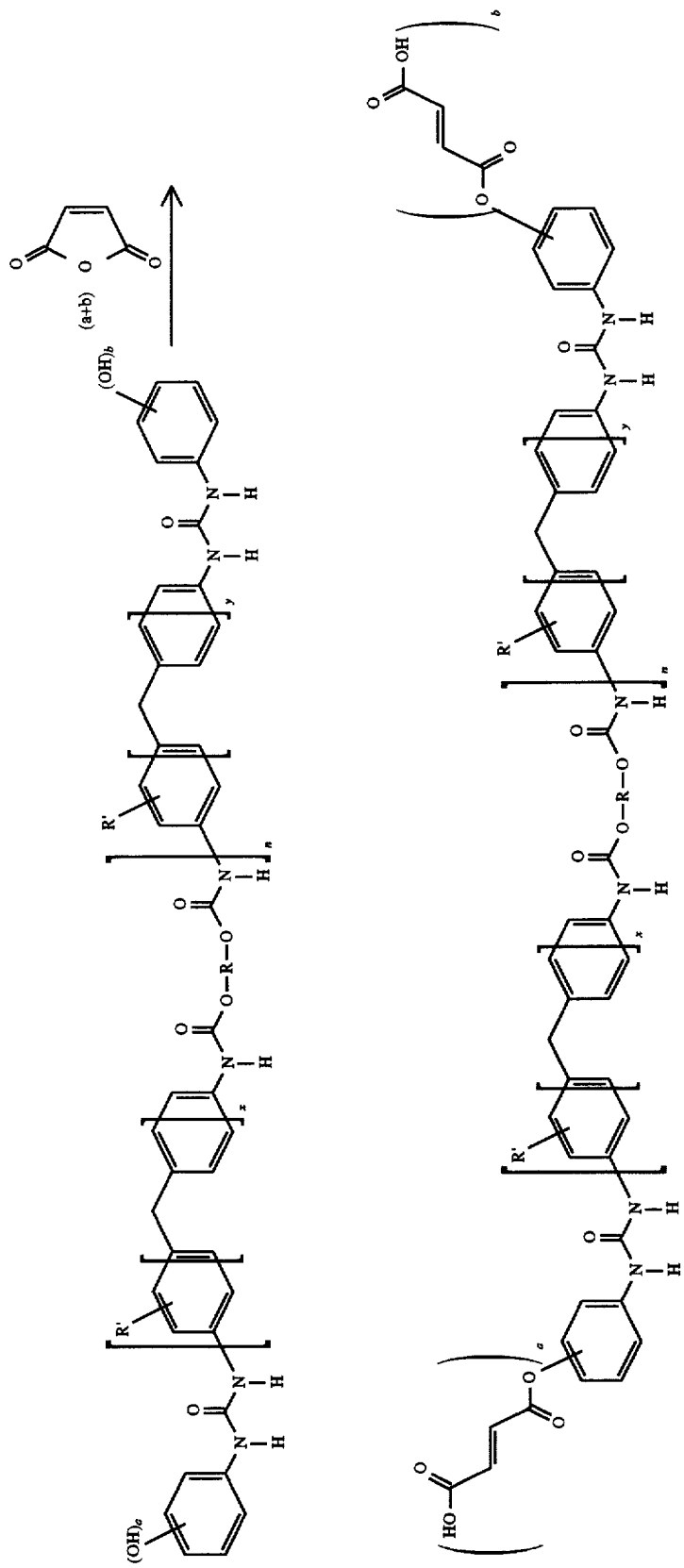

These polyurethane polymers are specially capped linear polyurethanes formed by the reaction of a diisocyanate of the formula O=C=N—X—N=C=O with an alkylene diol of the formula HO-R-OH in the molar ratio

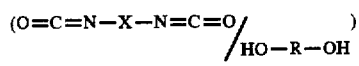

of >1, such that the resulting polymer equals the value of n as defined above, followed by the reaction with aminophenolic compounds. Diisocyanates suitable for use in making the polyurethanes include the following:

| | |
|---|---|
| bis(4-isocyanatocyclohexyl)methane | 1,2-diisocyanatoethane |
| 3-diisocyanatopropane | 1,2-diisocyanatopropane |
| 1,4-diisocyanatobutane | 1,5-diisocyanatopentane |
| 1,6-diisocyanatohexane | bis(3-isocyanatopropyl)ether |
| bis(3-isocyanatopropyl) sulfide | 1,7-diisocyanatoheptane |
| 1,5-diisocyanato-2,2-dimethylpentane | 1,6-diisocyanato-3-methoxyhexane |
| 1,8-diisocyanatooctane | 1,5-diisocyanato-2,2,4-trimethypentane |
| 1,9-diisocyanatononane | 1,10-diisocyanatopropyl)ether of 1,4-butylene glycol |
| 1,11-diisocyanatoundecane | 1,12-diisocyanatododecane |
| bis(isocyanatohexyl) sulfide | 1,4-diisocyanatobenzene |
| 2,4-diisocyanatotolylene | 2,6-diisocyanatotolylene |
| 1,3-diisocyanato-o-xylene | 1,3-diisocyanato-m-xylene |
| 1,3-diisocyanato-p-xylene | 2,4-diisocyanato-1-chlorobenzene |
| 2,4-diisocyanato-1-nitrobenzene | 2,5-diisocyanato-1-nitrobenzene |
| 2,2-bis(4-isocyanato)phenylpropane | bis(4-isocyanato)phenylethane |
| 4,4'-diphenylmethylene diisocyanate | 3,3'-diphenyl-methylene diisocyanate |
| polymethylene poly(phenyleneisocyanates) | isophorone diisocyanate | and mixtures thereof.

The preferred polyisocyanates are TDI, i.e., the mixture of 80% 2,4-tolylenediisocyanate and 20% 2,6-tolylenediisocyanate, or the individual monomer 2,4-tolylenediisocyanate (2,4-TDI) and 2,6-tolylenediisocyanate (2,6-TDI) and MDI, i.e., 4,4'-diphenylmethylene diisocyanate and 3,3'-diphenyl-methylene diisocyanate, or the individual monomer 4,4'-diphenylmethylene diisocyanate (4,4'-MDI) or 3,3'-diphenylmethylene diisocyanate (3,3'-MDI).

The polyalkylene ether or oxide diol comprises a divalent alkylene oxide moiety wherein the alkylene groups contain, on average, greater than three carbon atoms and not greater than five carbon atoms. Typically, they are based on ethylene oxide, 1,2-propylene oxide, 1,3-propylene oxide, 1,2-butylene oxide, 1,3-butylene oxide, 1,4-butylene oxide, 1,2-pentylene oxide, 1,3-pentylene oxide, 1,4-pentylene oxide, 1,5-pentylene oxide, 1,2-hexylene oxide, generally polymerized alone when the alkylene group contains greater than 3 carbon atoms, or as mixtures, so as to form a number average alkylene carbon content greater than about 3 and as high as about 5, preferably greater than 3.5 and as high as about 4.5. Many types of alkylene oxide diols are available for urethane production but all of those that have an average alkylene below about 3.5 have too high water absorption properties for use in high performance adhesive applications. Such exclude the polyethylene oxide diol homo-oligomers and the polypropylene oxide diol homo-oligomers from consideration in forming the polyurethane tougheners.

All of the polyalkylene oxide diols used in making the polyurethane tougheners/flow control aids are prepolymers of the alkylene oxide(s), created by the polymerization of the monomeric alkylene oxide. Such prepolymer formation as well as their reactions to form polyurethanes is notoriously well known. Of the prepolymers, a preferred one is based on the polymerization of 1,4-butylene oxide (i.e., tetrahydrofuran) to a molecular weight of from about 650 to about 5,000. Such prepolymers are commercially available from DuPont under the name Terathane®. Terathanes® range in molecular weights as low as about 650 to as high as about 2900, as well as molecular weight versions of about 1000 and 2000. Higher and lower molecular weight versions are also available. Such prepolymers provide low water absorption, flexible molecular structure, hydrolytic stability, and commercial availability at a moderate cost. Terathanes® have the formula HO(CH$_2$CH$_2$CH$_2$CH$_2$O)$_t$H where t has a value of about 8–9 to about 40, though higher and lower values are available, and such oligomers could be used in making the polyurethanes.

Terathanes® have been widely recommended for use in making polyurethanes by DuPont. For example, they have been recommended by DuPont for use in forming soft segments in polyurethanes. When used with TDI, DuPont advises that amines such as 4,4'-methylene-bis(2-chloroaniline) are favored as chain extenders or curatives. If 4,4'-MDI is the chain extender, DuPont advises that 1,4-butanediol is the favored chain extender. However, this invention does not rely on other monomers as chain extenders or curatives though chain extenders can be employed to raise the molecular weight of lower polyurethane prepolymers prior to the capping step in making the polyurethanes.

The polyester diols useful in making the polyurethanes are based on the reaction products of an aliphatic dicarboxylic acid derivative (such as the acid halide or ester) and an aliphatic diol derived from an polyalkylene oxide diol such as an alkylene glycol of 2 to about 5 carbon atoms, or based on the reaction of ε-caprolactone with a starter organic diol. These polyester diols are commercially available materials. They are typically less hydrolytically stable than the aforedefined polyalkylene oxide diols. Those that are desirable in the practice of the invention are those that possess low water absorption, flexible molecular structure, hydrolytic stability, and commercial availability at a moderate cost.

The linear polyester resins may be reaction products of saturated and unsaturated aliphatic dicarboxylic acids, such as malonic acid, succinic acid, adipic acid, maleic acid, fumaric acid, hexahydro or tetrahydrophthalic acid, "dimer" acid (dimerized fatty acids), and their respected anhydrides (where chemically possible), acid halides, and esters, with organic diols. The polyester may include in the reaction a minor amount, typically not more than 20 mol %, preferably not more than 10 mol %, of the acid component of the polyester, of an aromatic dicarboxylic acid such as o-phthalic acid or anhydride, isophthalic acid, terephthalic acid, their respected anhydrides (where chemically possible), acid halides, and esters. In addition to the above polyesters one may also use dicyclopentadiene modified unsaturated polyesters like those described in U.S. Pat. Nos. 3,986,922 and 3,883,612, so long as the polyester is linear. The organic diol employed to produce the polyester may include the alkylene glycols such as ethylene glycol, propylene glycol, butylene glycol, dipropylene glycol, diethylene glycol, neopentyl glycol, and the like, and the polyalkylene oxide glycols such as triglyme (b.p. 216° C.), tetraglyme (b.p. 276° C.), tripropylene glycol, tetrapropylene glycol, and the like.

Chain termination of the linear polyalkylene oxide or polyester polyurethanes is effected by reacting more than one mole of the diisocyanate for each mole of the polyalkylene oxide diol and/or polyester diol. The amount of the stoichiometric excess of the diisocyanate will determine the degree of polymerization (n) of the polyurethane. A stoichiometric amount of the diisocyanate to the diol is 1 mole of each. If the reaction is conducted under anhydrous conditions, using an excess of diisocyanate over the stoichiometric amount results in a polymer that is chain terminated with isocyanato groups at each end. If any water is present in the polyurethane formation step, then stoichiometry should take that into account, because water will generate more near-terminal residing urea, as well as terminating isocyanato groups appended thereto. The level of excess diisocyanate will determine the degree of polymerization and thus determine the value of n in the above formulas. Such an isocyanato-terminated polymer is not a thermally or chemically stable polymer.

The hydroxy aromatic amino compound for terminating the isocyanato containing polyurethane is preferably a structure of the formula:

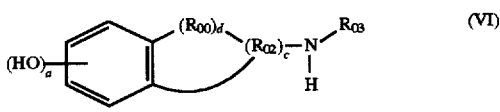

(VI)

wherein the combination of $R_{00}$ and $R_{02}$ is equivalent to $R°$ and $R_{01}$ defined above, and in particular, $R_{00}$ may be a covalent bond or a divalent nonaromatic group such as alkylene, alkylidene, oxygen, carbonyl, sulfone, and the like, d is 0 or 1 and when it is 1, the hatched line designating a fused ring bond is nonexistent, and when d is 0, the hatched line may exist as a fused ring bond to $R_{02}$. $R_{02}$ is aryl, polyaryl, fused ring aryl, polyfused ring aryl, cycloalkyl and the like, and c is 0 or 1. When d is 1, c is 1, and when d is 0, c may be 0 or 1. $R_{03}$ is hydrogen, or alkyl of 1 to about 14 carbon atoms. Illustrative examples of suitable amines are the following:

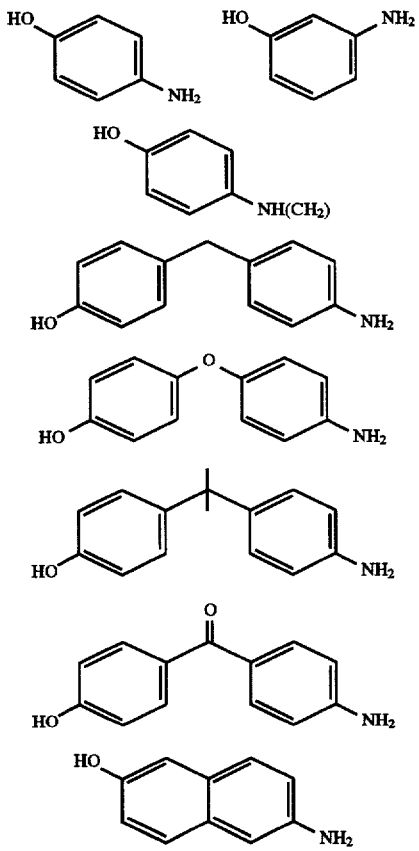

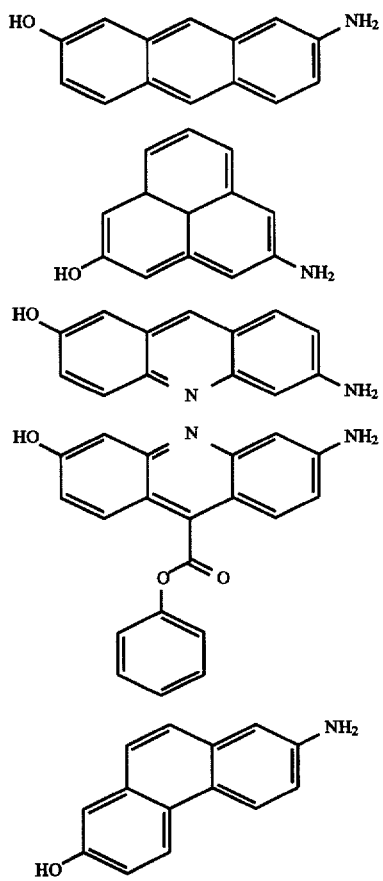

The aminophenols, p, m or o-aminophenol, prove to be effective terminating molecules for the isocyanato capped polyurethanes. Solubility or a low melting point gives the meta product some advantage but the p-aminophenol dissolves readily in the toughener polymer—epoxide reaction system at the temperatures generally used (80°–120° C.). The low molecular weight of these aminophenols (109.1) means that relatively small amounts can be used for termination, solubility is high, the termination reaction is rapid, governed mostly by the time required to get good dispersion in the high viscosity system. The powdered amino phenol can be added directly to the reaction mixture or more desirably can be powdered, mixed with a small portion of the low oligomer epoxide resin diluent, discussed below, and then added. Measurement of the IR absorption ratio of the isocyanate group 2240 $cm^{-1}$ peak to the 2840 $cm^{-1}$—CH peak can be used to ensure that termination is complete.

During the polymerization of diisocyanates with the hydroxy terminated alkylene oxide or polyester based materials, high molecular weights are attained (~20K—120K, more typically in the range of about 30K to about 100K). As a result, viscosities became very high and at rational reaction temperatures (~50°–170° C., preferably from about 80° C.–120° C.) stirring in laboratory or production equipment can become difficult. Use of a solvent as a diluent (e.g., methylethylketone (MEK), tetrahydrofuran (THF), and the like) of the reactants and the reaction products, though usable in making the polymers of the invention, adds the problem of its subsequent removal with a concomitant increase in production cost. Advantage is taken of the very low reactivity of hydroxyl groups with epoxide groups (unless catalyzed) and also the low reactivity of isocyanate groups with epoxide groups (unless the complex formation of oxazolidone is deliberately forced). Therefore, oligomerfree and thus secondary hydroxyl-free, epoxide resins can be used as unreactive diluents during the polymer formation. Such epoxide resins are subsequently compatible with formulation needs in future adhesive systems. For this dilution during reaction, epoxides as free as possible from oligomers should be used. Shell's Epon® 825 (the diglycidyl ether of hisphenol A) has been successfully used as a diluent even although the small amount of oligomer present (5%) did show some reaction. At 1/1 ratio to total derived polymer, Epon® 825 gave polymer products easily stirred at needed production temperatures and at that level should meet most subsequent formulation needs. D.E.N.® 332 from Dow Chemical should also be suitable. The Bis F resins, such as Epiclon® 830S, if distilled to eliminate oligomers, could also be used.

Illustrative of suitable diluents are epoxy monomers and dimers of the following formula:

crosslinked yet are thermoprocessable, which when discretely provided in the matrix resin render the resin non-pourable and tacky, and also toughen it.

One class of suitable elastomer-type thermoplastic ABS (acrylonitrile-1,4-butadiene-styrene) block copolymers that are typically used as modifiers of other resin systems. They are characterized as having a wide range of properties though the preferred systems of the invention utilize copolymers that are high rubber types that, when compared to other copolymers of this type, have a relatively low tensile strength, low tensile modulus, higher impact resistance, low hardness and heat deflection temperature.

Another elastomer that is found desirable are the carboxyl and amine terminated liquid butadiene acrylonitrile copolymers. Such copolymers may contain pendant carboxyl groups in the interior of the polymer structure through the inclusion of methacrylic or acrylic acid in the polymerization or through the hydrolysis of some of the pendant nitrile units. Such polymers react with the epoxy resin and as a result, the epoxy forms the hard segment generating the elastomer properties.

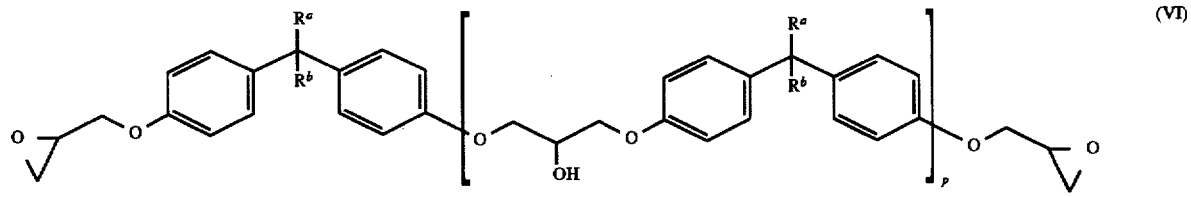

(VI)

wherein $R^a$ and $R^b$ are each hydrogen, alkyl of 1–3 carbon atoms or phenyl, preferably alkyl such as methyl, and p has a value of 0 to <1, preferably less than about 0.2. Most preferably, p is equal to 0.

The reaction conditions for forming the polyurethane from the diisocyanate and the diol is a temperature of about 50° C. to about 200° C. with mixing in the presence of a diluent, such as a conventional solvent, as indicated above, or the reactive diluent comprising the epoxy monomeric resin indicated above. The reaction should be carried out in the absence of added water, and anhydrous conditions are preferred. Conditions that remove water from the reactants before reaction and during reaction are desirable. No special catalysts are needed to effect the reaction but a catalyst that does not adversely affect the reactions can be employed. Catalysts are needed in polymerization reactions using aliphatic isocyanates.

The foregoing polyurethanes and their manufacture are described in commonly assigned copending U.S. Application Ser. No. 08/349,876, filed Dec. 6, 1994.

Another class of flow control aid thixotropic agents and/or elastomer-type polymers that provide discrete elastomer phases (second phases) in the thermosetting resin matrix. Certain of these materials may reduce, to some finite degree, the crosslinking density of the thermoset resin (C-stage). Many of these materials introduce very favorable properties to the resulting thermoset resin. For example, a particularly desirable material for this purpose, is an elastomeric polymer containing soft and hard segments, the hard segments acting like or forming on processing, crosslinking of the elastomeric type. Some of these elastomeric types contain functional end groups that allow it to couple with complementary functional monomers or polymers to form the desired elastomer in situ of the thermosetting resin and render it non-pourable and tacky, while toughening the cured resin. As a class, these elastomeric polymers act or are Another class of block thermoplastic elastomers is Kraton®, available from Shell Chemical Company. These thermoplastic rubber polymers possess usable thermoplastic properties. They can be softened and they flow under heat and pressure. They then recover their structures on cooling. The chemical make-up are of three discrete blocks of the linear or A-B-A type. They are available as styrene-butadiene-styrene (S-B-S) block copolymers, styrene-isoprene-styrene (S-B-S) block copolymers and styrene-ethylene/butylene-styrene (S-EB-S) block copolymers. They are characterized by styrene polymer endblocks and an elastomeric midblock. After processing, the polystyrene endblocks physically crosslink, locking the rubber network in place. This physical crosslinking is reversible on heating.

Another series of the Kraton® thermoplastic rubbers are the diblock polymers in which one block is a hard thermoplastic and the other is a saturated soft elastomer. Illustrative of this series is Kraton® G 1701, a diblock polymer of a hard polystyrene block and a saturated, soft poly(ethylene-propylene) block.

Other rubbers or elastomers include: (a) homopolymers or copolymers of conjugated dienes having a weight average molecular weight of 30,000 to 400,000 or higher as described in U.S. Pat. No. 4,020,036, in which the conjugated dienes contain from 4–11 carbon atoms per molecule such as 1,3-butadiene, isoprene, and the like; (b) epihalohydrin homopolymers, a copolymer of two or more epihalohydrin monomer, or a copolymer of an epihalohydrin monomer(s) with an oxide monomer(s) having a number average molecular weight (Mn) which varies from about 800 to about 50,000, as described in U.S. Pat. No. 4,101,604; (c) chloroprene polymers including homopolymers of chloroprene and copolymers of chloroprene with sulfur and/or with at least one copolymerizable organic monomer wherein chloroprene constitutes at least 50 weight percent of the organic monomer make-up of the copolymer as described in U.S. Pat. No. 4,161,471; (d) hydrocarbon polymers including ethylene/propylene dipolymers and copolymers of ethylene/propylene and at least one nonconjugated diene, such as ethylene/propylene/hexadiene/norbornadiene, as described in U.S. Pat. No. 4,161,471; (e) conjugated diene butyl elastomers, such as copolymers consisting of from 85 to 99.5% by weight of a $C_4$–$C_5$ isolefin combined with 15 to 0.5% by weight of a conjugated multi-olefin having 4 to 14 carbon atoms, copolymers of isobutylene and isoprene where a major portion of the isoprene units combined therein have conjugated diene unsaturation, as described in U.S. Pat. No. 4,160,759.

Specific illustrations of suitable elastomeric polymers are the following:

1. Hycar™ CTBN liquid reactive rubbers, carboxyl terminated butadiene-acrylonitrile copolymers sold by B. F. Goodrich.
2. Hycar™ CTBNX, similar to CTBN except that they contain internal pendant carboxyl groups, also supplied by B. F. Goodrich.
3. Hycar™ ATBN, amine terminated butadiene-acrylonitrile copolymers sold by B. F. Goodrich.
4. K 1102-28:72 styrene:butadiene linear SBS polymer, available from Shell Chemical Company as Kraton® 1102.
5. KDX 1118-30:70 styrene:butadiene copolymer containing 20% SBS triblock and 80% SB diblock, available from Shell Chemical Company as Kraton® DX 1118.
6. KG 1657-14:86 styrene:ethylene-butylene:styrene copolymer available from Shell Chemical Company as Kraton® G1657.
7. S 840 A-Stereospecific 43:57 styrene-butadiene SB rubber available from Firestone Synthetic Rubber & Latex Company as Stereon® 840A.
8. SBR 1006-random 23.5:76.5 styrene:butadiene SB block copolymer rubber available from Goodrich Chemical Company as Ameripol® 1006.
9. SBR 1502-Random 23.5:77.5 styrene:butadiene rubber available from Hules Mexicanos, or from Goodrich Rubber Company as Ameripol™ 1502.
10. Blendex™ modifier resins (e.g., 305, 310, 311, 336, 338 and 405)—ABS polymers sold by General Electric. Different varieties are available and their suitability depends on the properties sought.

Additional flow reductions are provided by thixotroping agents such as fumed silica. Illustrative of thixotropic agents are high surface area fumed silicas and organosilyl blocked fumed silicas, and the like.

The thin film may be characterized as non-pourable. Optionally, the film may be tacky as well. This condition can be achieved in a number of ways. Many thermosetting resins are solids at about 23° C. and many of them are liquids at this temperature. Both kinds of resins can be made fluid non-pourable and tacky. For example, a resin that is solid and a resin that is liquid can be combined to form a mixed resin system that is non-pourable and tacky. In addition, a solid or liquid thermosetting resin can have incorporated in it a variety of diverse materials that will render the resin fluid non-pourable at conventional handling temperature conditions and fluid non-pourable and tacky at room temperature (about 15°–37° C.). Conventional handling temperatures are defined as a temperature of between about −20° C. to about 43° C.[5]

[5]This range reflects the fact that material handling can require low temperature storage to preclude premature reaction of the thermosetting resin system and relatively high temperatures because the film may be used on a hot factory floor.

Though the in situ-expandable thermoplastic particles or the solid chemical blowing agent will render a liquid thermosetting resin more viscous, they alone are not effective for making the film non-pourable. If the thermosetting resin is solid, it can be calendered into a film by melting the resin with heat under conditions that avoid condensation or addition of the resin to a thermoset condition (C-stage). If the resin is a liquid, it can be blended with thixotropic agents, other solid resins and/or liquid or thermoplastic elastomeric modifiers to convert the resin from a liquid to a non-pourable and tacky material.

The thermoplastic polymer used in forming the in situ-expandable thermoplastic particles are readily prepared from a wide variety of materials. A number of patents refer to their manufacture. For example, U.S. Pat. No. 3,615,972 describes their preparation by polymerizing the monomer of an aqueous dispersion of (1) organic monomeric materials suitable for polymerization to a thermoplastic resinous material having the desired physical properties, (2) a liquid blowing or raising agent which exerts a little solvent action on the resulting polymer, and in a quantity in excess of that which is soluble in the polymer, and (3) a dispersion stabilizing material that is utilized to maintain the dispersion. The resulting solid spherical particles have a quantity of the liquid-blowing agent encapsulated in them as a distinct and separate phase.

The thermoplastic polymers are formed by the polymerization of one or more of a variety of different types of alkenyl monomers, such as those of the formula:

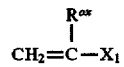

to form homopolymers or copolymers, such as random or ordered (including block) copolymers. In the above formula, $R^{OX}$ may be hydrogen, alkyl, such as methyl, ethyl and the like, or halogen, such as chlorine, fluorine, bromine or iodine, and $X_1$ may be an aromatic containing moiety bonded via an aromatic carbon atom, a carbonyl oxy ester moiety, halogen, cyano, oxycarbonyl ester, carboxyl, and the like. Illustrative of these monomers are those in which $X_1$ is aromatic containing, such as styrene, o-methylstyrene, m-methylstyrene, p-methylstyrene, ethylstyrene, α-vinylxylene, α-chlorostyrene, bromostyrene, vinylbenzylchloride, p-tert.-butylstyrene, and the like. Also illustrative of these monomers are those in which $X_1$ is a carbonyl oxy ester moiety to form acrylate monomers alone or in combination with the alkenyl aromatic monomers may also be utilized. Such acrylate-type monomers include methyl methacrylate, ethyl acrylate, propyl acrylate, butyl acrylate, butyl methacrylate, propyl methacrylate, butyl methacrylate, lauryl acrylate, 2—ethyl hexyl acrylate, ethyl methacrylate, and the like. $X_1$ and $R^{OX}$ may be a halogen, such as chlorine, fluorine, bromine and iodine, thereby to encompass the formation of copolymers of vinyl chloride and vinylidene chloride, acrylonitrile with vinyl chloride, vinyl bromide, and similar halogenated vinyl compounds. $X_1$ may be a cyano group and this includes polymers of acrylonitrile and methacrylonitrile. $X_1$ may be an oxycarbonyl ester, such as the vinyl ester, e.g., vinyl acetate, vinyl butyrate, vinyl stearate, vinyl laurate, vinyl myristate, vinyl propionate, and the like. One may also employ for specific purposes ethylenically unsaturated copolymerizable acids such as acrylic acid, methacrylic acid, itaconic acid, citraconic acid, maleic acid, fumaric acid, vinylbenzoic acid, and the like.

The thermoplastic polymers may also include copolymers (of the random or ordered varieties, especially blocked copolymers) of the monomers described above with a variety of hydrocarbon monomers, such as propylene, butene, and one or more dienes, such as:

straight chain acyclic dienes such as: 1,4-hexadiene, 1,6-octadiene, and the like;

branched chain acyclic dienes such as: 5-methyl-1,4-hexadiene, 3,7-dimethyl-1,6-octadiene, 3,7-dimethyl-1,7-octadiene and the mixed isomers of dihydromyrcene, dihydroocinene, and the like;

single ring alicyclic dienes such as: 1,4-cyclohexadiene, 1,5-cyclooctadiene, 1,5-cyclododecadiene, and the like;

multi-ring alicyclic fused and bridged ring dienes such as: tetrahydroindene, methyltetrahydroindene, dicyclopentadiene, bicyclo-(2,2,1)-hepta-2,5-diene, alkenyl, alkylidene, cycloalkenyl and cycloalkylidene norbornenes such as 5-methylene-2-norbornene (MNB), 5-ethylidene-2-norbornene (ENB), 5-propyl-2-norbornene, 5-isopropylidene-2-norbornene, 5-(4-cyclopentenyl)-2-norbornene, 5-cyclohexylidene-2-norbornene, and the like.

The thermoplastic polymer used in forming the in situ-expandable thermoplastic particles may also be made from condensation type polymers, such as nylon-6,6; nylon-6; nylon-4,6; polyester from polyethylene terephthalate; Kevlar™ polyaramide; polycarbonates (viz., poly (2,2-bis (1,4-oxyphenyl) propane carbonate)); polyarylates (viz., poly (2,2-bis(1,4-oxyphenyl) propane terephthalate); polyimides; polyetherimides, such as Ultem™; polysulfones (see U.S. Pat. Nos. 4,175,175 and 4,108,837), such as Udel™ and Radel™ A-400; the polyethersulfones (see U.S. Pat. Nos. 4,008,203, 4,175,175 and 4,108,837), such as Victrex™; polyarylsulfones; polyarylamideimides, such as Torlon™; and the like.

A wide variety of blowing or raising agents may be incorporated within the polymerization system. They can be volatile fluid-forming agents such as aliphatic hydrocarbons including ethane, ethylene, propane, propylene, butene, isobutylene, neopentane, acetylene, hexane, heptane, or mixtures of one or more such aliphatic hydrocarbons having a molecular weight of a least 26 and a boiling point below the range of the softening point of the resinous material when saturated with the particular blowing agent utilized.

Other suitable fluid-forming agents are the chlorofluorocarbons such as those described in U.S. Pat. No. 3,615,972 (column 4, lines 21–30) and tetraalkyl silanes such as tetramethyl silane, trimethylethyl silane, trimethylisopropyl silane and trimethyl-n-propyl silane. As pointed out in this patent, the boiling point of such foaming agents at atmospheric pressure should be about the same temperature range or lower than the softening point of the resinous material employed.

Blowing agents such as the Freons®, such as trichlorofluoromethane, hydrocarbons such as n-pentane, i-pentane, neo-pentane, butane, i-butane, azodicarbonamide are commonly suggested blowing agents found in these types of in situ-expandable particles. Typically, the unexpanded particles contain from about 3 to about 40 weight % blowing agent.

As pointed out in U.S. Pat. No. 4,397,799, patented Aug. 9, 1983, the particle size of the unexpanded particles, as well as the expanded microspheres can vary widely. Particle sizes for the unexpanded particles can range, for example, from about 1 μm to about 1 mm, preferably from about 2 μm to about 0.5 mm. One version of in situ-expandable particles is sold under the name Expancel®, by Nobel Industries Sweden, Sundsvall, Sweden (U.S. address: Marrietta, Ga. 30062). They range in unexpanded particle size from about 5 μm to about 50 μm. The particle diameters expand 2 to 5 times. Preferably, the in situ-expandable particles used have a mixed particle size of wide spread to achieve the best packing, on expansion, in the syntactic molded foam. A particularly preferred in situ-expandable particle is Expancel® 091 DU, which is believed to be a terpolymer of vinylidene chloride, acrylonitrile and methacrylonitrile containing 10–18 weight % isopentane, and possesses the following properties: average unexpanded particle size of about 12 μm with a spread of about 5–50 μm; true density (expanded in water at 100° C., kg/m$^3$), <20; TMA—T(start) °C., 125–130; T(max) °C., ~183; TMA-density,kg/m$^3$, <17.

The chemical blowing agent particles (with a particle size ranging from about 1 μm to about 1 mm, preferably from about 2 μm to about 0.5 mm) that can be incorporated are inorganic and organic solid compositions that typically decompose at a particular temperature to generate a volatile (gas) component that causes microcell formation in the thermosetting matrix resin. Typical inorganic blowing agents include the ammonium carbonates and bicarbonates, alkali metal carbonates and bicarbonates such as lithium carbonate, sodium carbonate, potassium carbonate, rubidium carbonate, cesium carbonate, lithium bicarbonate, sodium bicarbonate, potassium bicarbonate, rubidium bicarbonate, cesium bicarbonate, mixture of the carbonates and bicarbonates as well as mixtures of the alkali metal form of the carbonates and bicarbonates. These carbonates and bicarbonates can be made to decompose at lower temperatures by incorporating organic carboxylic acids and acid anhydrides blowing agent accelerators into the formulation. Suitable organic carboxylic acids and anhydrides are citric acid, acetic acid and anhydride, maleic anhydride. There are a variety of chemical blowing agents sold under the name Celogen™ (Naugatuck Chemical Division of U.S. Rubber Company (Uniroyal)) that include toluene sulfonyl hydrazide, toluene sulfonyl semicarbazide, 5-phenyl tetraazole, azodicarbonamide, and the like, that are excellent chemical blowing agents suitable for the purposes of the invention. The chemical blowing agents may be employed in the formulations of the invention in amounts ranging from about 0.1 to about 3 parts by weight, preferably from about 0.5 to 2.0 parts by weight, of the thermosetting resin formulation.

Low Profile Additives

There may be incorporated into the thermosetting resin formulation certain thermoplastic materials known in the field as low profile additives. These can be polymers of vinyl acetate, acrylics, saturated polyesters, polyurethanes, styrene-butadiene and similarly used materials.

Suitable thermoplastic vinyl acetate polymer low profile additives are thermoplastic poly(vinyl acetate) homopolymers and copolymers containing at least 5 weight percent vinyl acetate. Such polymers include, for example, vinyl acetate homopolymer; carboxylated vinyl acetate polymers include copolymers of vinyl acetate and ethylenically unsaturated carboxylic acids, such as acrylic acid, methacrylic acid, maleic acid, fumaric acid, itaconic acid and the like or anhydrides such as maleic anhydride; vinyl acetate/vinyl chloride/maleic acid terpolymer, and the like. Reference is made to U.S. Pat. Nos. 3,718,714 and 4,284,736 and British Patent No. 1,361,841 for descriptions of some of the suitable vinyl acetate polymer low profile additives. The useful vinyl acetate polymer low profile additives ordinarily have molecular weights within the range of from about 25,000 to about 175,000. Suitable polyvinyl acetate low profile additives are LP-40 and LP-40A that are sold by Union Carbide Chemical & Plastics Corp., Danbury, Conn.

Suitable thermoplastic saturated polyester low profile additives are, in general, low molecular weight saturated polymers of polymerizable linear and/or cyclic esters and carboxylated saturated polymers and said polymerizable esters having at least one carboxyl group per molecule. Polymers of linear and/or cyclic esters including carboxylated polymers having an average of at least one carboxyl group per molecule that maybe used in accordance with the present invention are those which possess a reduced viscosity of at least about 0.1, and preferably from about 0.15 to about 15 higher. The preferred polymers of cyclic esters have a reduced viscosity of about 0.2 to about 10.

Thermoplastic saturated polymers of linear and/or cyclic esters are well known and the carboxylated saturated esters are well known and such thermoplastic saturated polymers, and particularly polymers prepared from epsilon caprolactones, have been advantageously employed as low profile additives. Reference, for example is made to U.S. Pat. Nos. 3,549,586 and 3,668,178 for descriptions of thermoplastic saturated polyester low profile additives and carboxylated thermoplastic saturated polyester low profile additives prepared from cyclic esters.

Other thermoplastic saturated polyesters that are useful as low profile additives are those based on condensation products of, primarily, dicarboxylic acids and organic diols. Some examples of such diacids are adipic acid, isophthalic acid, terephthalic acid and the like and such glycols could be ethylene glycol, diethyl glycol, neopentyl glycol and the like.

Also suitable in certain aspects of the invention are thomoplastic polyalkyl acrylate or methacrylate low profile additives including, for example, homopolymers of methyl methacrylate, ethyl methacrylate, butyl methacrylate, methyl acrylate, ethyl acrylate; copolymers of methyl methacrylate and lower alkyl esters of acrylic and methacrylic acids, and copolymers of methyl methacrylate with minor amounts of one or more of the following: lauroyl methacrylate, isobornyl methacrylate, acrylamide, hydroxyethyl methacrylate, styrene, 2-ethylhexyl acrylate, acrylonitrile, methacrylic acid, polystyrene, styrene copolymers, such as styrene/butadiene copolymers, cellulose acetate buryate, alkylene oxide polymers, urethane polymers, and the like.

Molecular weight of the alkyl acrylate or methacrylate polymers useful in the invention may vary over a wide range from 10,000 to 1,000,000 and preferably from 25,000 to 500,000.

Urethane polymers that can be employed in this invention, alone or as mixtures with other low profile additives, are broadly structured and some examples can be found in U.S. Pat. No. 4,035,439; EP 74-746; and U.S. Pat. No. 4,421,894.

The low profile additives may usually be employed in the compositions of the invention in proportions from about 1 to 25 weight percent, and preferably from about 5 to 20 weight percent, based upon the total weight of thermosetting resin, low profile additive and other reactive components.

The low profile additive can function alone or in combination with other thickening agents, as a thickening contributor to the flow characteristics of the resin.

The thin film may be characterized as non-pourable. Optionally, the film may be tacky as well. This condition can be achieved in a number of ways. Many thermosetting resins are solids at about 23° C. and many of them are liquids at this temperature. Both kinds of resins can be made fluid non-pourable and tacky. For example, a resin that is solid and a resin that is liquid can be combined to form a mixed resin system that is non-pourable and tacky. In addition, a solid or liquid thermosetting resin can have incorporated in it a variety of diverse materials that will render the resin fluid non-pourable at conventional handling temperature conditions and fluid non-pourable and tacky at room temperature (about 15°–37° C.). Conventional handling temperatures are defined as a temperature of between about −20° C. to about 43° C.[6]

[6] This range reflects the fact that material handling can require low temperature storage to preclude premature reaction of the thermosetting resin system and relatively high temperatures because the film may be used on a hot factory floor.

Typical formulations of the invention are set forth in the following tables. A typical resin formulation comprises the following:

| Component | Typical Components | Range (% w/w) |
|---|---|---|
| Resin | | |
| A mixture of di- and multifunctional resins selected to give a desired level of viscosity, tack and glass transition temperature. | Novolac Epoxy Bis A epoxy Bis F epoxy Tris epoxy Brominated epoxy | 5–60 |
| Fire Retardant Fillers | | |
| Filler(s) that enhances the fire retardancy of the formulation. | Decabromobiphenyl Melamine pyrophosphate | 0–40 |
| Wetting Agent | | |
| Selected to promote complete wetting of filler by the resin component. | Non-ionic Surfactant | 0.0–1.0 |
| Toughener | | |
| An elastomeric material selected to improve durability | ABS Polymers Silicone Polymers | 0.0–10.0 |
| Filler | | |
| Amorphous silica particulates added to refine cured CTE. | Amorphous Silica | 25–90 |
| Curing Agent | | |
| Amine, phenolic and/or homopolymerization catalysts | Aromatic Amines, Guanides, Novolacs, Imidazoles, Imidazole Salts, Phosphines. | 50–125% Stoichiometry, 0.01–2.5% Catalyst |
| Thixotrope | | |
| Flow control agent | Fumed Silica Treated Clays | 0.0–5.0 |

Specific representative illustrations of such film formulations are the following:

| | Weight % | | | |
|---|---|---|---|---|
| Component | Adhesive A | Adhesive B | Adhesive C | Adhesive D |
| Epon 828 (1) | 8.5 | — | — | — |
| Tactix 742 (2) | 12.7 | — | — | — |
| Tactix 695 (3) | 12.7 | — | — | — |
| DEN 438 (4) | 0.8 | 21.6 | 16.4 | 38.8 |
| Epiclon 830S (5) | 5.6 | — | — | — |
| MY 721 (6) | — | 5.0 | 3.8 | — |
| PC 1344 (7) | — | 0.2 | 0.1 | 0.4 |
| Blendex 311 (8) | 8.5 | 5.0 | 3.8 | — |
| Novacite 550 (9) | 42.4 | — | — | — |
| GP 31 (10) | — | 6.2 | — | — |
| Teco-Sil 200F (11) | — | 55.6 | 70.1 | 27.1 |
| TS 720 (12) | 2.6 | 0.6 | 1.2 | 1.2 |

-continued

| Component | Weight % | | | |
|---|---|---|---|---|
| | Adhesive A | Adhesive B | Adhesive C | Adhesive D |
| 4,4'-DDS (13) | 5.4 | 5.1 | 3.9 | — |
| Dicy (14) | 0.9 | 0.9 | 0.7 | — |
| BTDA (15) | — | — | — | 31.4 |
| 2-MI-Azine (16) | — | — | — | 1.2 |
| Total | 100.0 | 100.0 | 100.0 | 100.0 |
| % Resin | 40.3 | 26.6 | 20.3 | 38.8 |
| % Wetting Agent | 0.0 | 0.2 | 0.1 | 0.4 |
| % Toughener | 8.5 | 5.0 | 4.2 | 0.0 |
| % Filler | 42.4 | 61.8 | 70.1 | 27.1 |
| % Thixotrope | 2.6 | 0.6 | 1.2 | 1.2 |

Notes:
(1) Bis A based resin, Shell Chemical Co.
(2) Tris epoxy resin, Dow Chemical Co.
(3) Toughened epoxy resin, Dow Chemical Co.
(4) Epoxidized phenol novolac, Dow Chemical Co.
(5) Bis F resin, Dainippon Ink
(6) Epoxidized aromatic amine, Ciba Geigy
(7) Nonionic surfactant, Monsanto
(8) ABS toughener, General Electric
(9) Silica powder, Malvern Corp.
(10) Silica powder, Harbison Walker
(11) Silica powder, CE Minerals
(12) Fumed silica, Cabot
(13) 4,4'-diaminodiphenyl-sulfone, Ciba Geigy
(14) Dicyandiamide, Air Products
(15) Benzophenone Dianhydride
(16) Methylimidazole-Azine Catalyst These resin formulations are made by conventional mixing of the components in standard mixing equipment for viscous compositions. Good results have been obtained using a Ross® Double Planetary Mixer, provided with vacuum construction and jacketing to control temperature and deaerate the mixture. Mixing is typically effected by blending the resin, unexpanded particles, elastomer components, extenders, diluents, curing agent and vacuum pumping to remove entrained air. The temperature chosen is variable depending on the viscosity of the formulation. It may be desirable to separately mix the resin and the curing agent. In such a case, the formulation may be divided up to mix the resin with some portion of the formulation to effect a well dispersed condition and do the same with the curing agent, and then combine the well dispersed mixes, so as to mix them all under conditions avoiding premature reaction. Such procedures are well within the skill of the art.

The following discussion relates to the drawings and the figures shown therein. None of the figures show true dimensions of the various components there depicted. FIG. 1 illustrates schematically the debossment of the metal foil and the compositing of it to form the debossed laminate article. FIG. 1A shows the compression of a metal tool 13 containing male molding surfaces 15 protruding from tool surface 17 indicative of the printed circuit pattern for a printed circuit board onto foil 14, made of any of a variety of conductive metals such as such as aluminum, copper, chromium, gold, silver, magnesium, titanium, nickel, brass, zinc, and the like. Copper foil is the most preferred. Substrate 12 may be any resilient surface, such as rubber (foam or solid), fluids such as water, oil, mercury, and the like (preferably under pressure), soft wood such as balsa, cork, a thermosetting resin, and the like materials. Substrate 12 allows for the shaping of the foil about the stamping surface of tool 13.

Figure 1B:
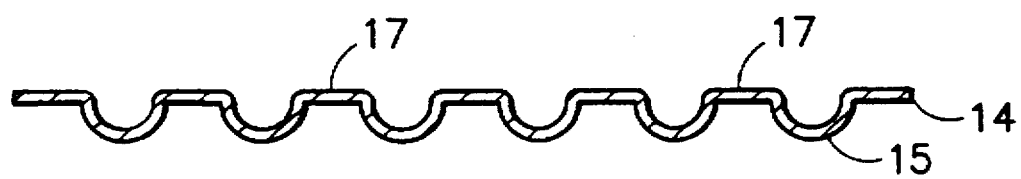
FIG. 1B shows the side view of a debossed metal loft.

FIG. 1B show foil 14 shaped by tool 13 to contain the replicating tool surfaces 15 and 17.

Figure 1C:
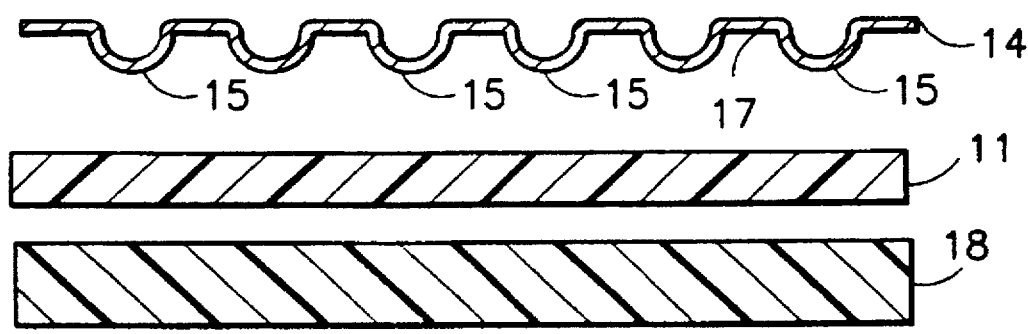
FIG. 1C shows the exploded side view of a debossed metal foil superimposed over a thermosetting resin film supported on a resilient layer.

In the embodiment of FIG. 1C, thermosetting resin film 11 rests on solid substrate 18, which may correspond to substrate 12 above, or be a solid unyielding surface such as metal, hard wood, plastic and the like, or which can be a supporting layer and have any composition such as that of a fiber glass resin prepreg, a thermoplastic polymer, and the like. Debossed foil 14 is superimposed over film 11, in position to be lowered into film 11 or to have substrate 12 raised so that film 11 is pushed into the surface of foil 14 containing molding surfaces 15. Alternatively, both substrate 12 and foil 14 can be moved to merge them and cause surfaces 15 to deboss film 11.

Howsoever that foil 14 and film 11 merge so that molding surfaces 15 of foil 14 penetrate the surface of uncured film 11, film 11 will yield to the pressure imposed by surfaces 15. Because of the thickened nature of film 11, penetration of the surface of film 11 will not radiate flow of the film outside of the area of the male surfaces 15. Instead, the displaced content of film 11 will cause the remainder of film 11 to rise, until such time that surface 17 contacts film 11. When surface 17 contacts film 11, the overall pressure imposed on film 11 will cause film 11 to expand in surface area. However, if surfaces 15 too rapidly penetrate film 11, it is possible that the penetration will cause some small amount of film 11 to flow, thereby causing film 11 to expand in surface area.

From the above, it is easily seen that substrate 18 can be a stationary surface, e.g., a platen that has an upward and downward movement, a moving table that follows a moving foil 14, an endless belt surface where foil 14 is part of a continuous strip, and the like arrangements.

Figure 1D:
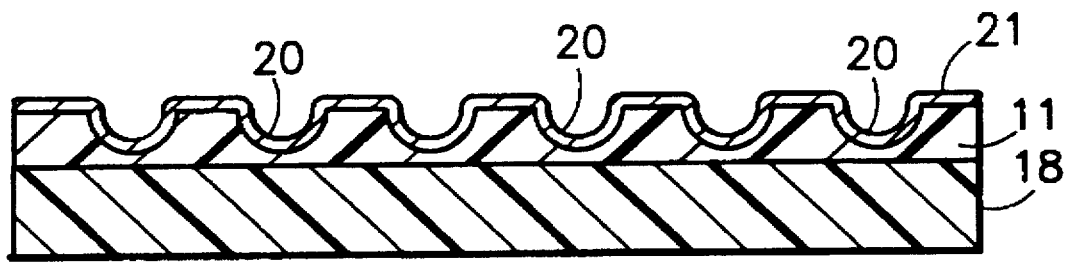
FIG. 1D shows the side view of a PB precursor containing a debossed metal foil-thermosetting resin laminate. The laminate rests on a resilient supporting layer.

FIG. 1D shows the laminate of the metal foil 21 with debossed surfaces 20 embedded in resin film 11. The resulting structure as shown FIG. 1D contains grooves 20 that are the female correspondents to male surfaces 15. In this embodiment, film 11 is adhesively bonded to supporting layer 18, which in this case, can have any composition such as that of a fiber glass resin prepreg, a thermoplastic polymer, a woven fabric, scrim, and the like.

The foils are typically thin sheets of metal with a thickness usually thinner than about 2 mils (0.00508 cm.), preferably not exceeding about 1 mil (0.00254 cm.), more generally not exceeding about 0.1 mil (0.000254 cm.), frequently, not exceeding about 0.02 mils (0.0000508 cm.) and on some occasions, as thin as about 0.001 mil ($2.5 \times 10^{-6}$ cm.). The foil sheet can be made by thermal vapor deposition or cathode sputtering, or by milling the pure metal. The foil sheet 14 can be made directly on a tool surface by vapor deposition of the metal onto the tool from which it can be released.

Figure 1E:
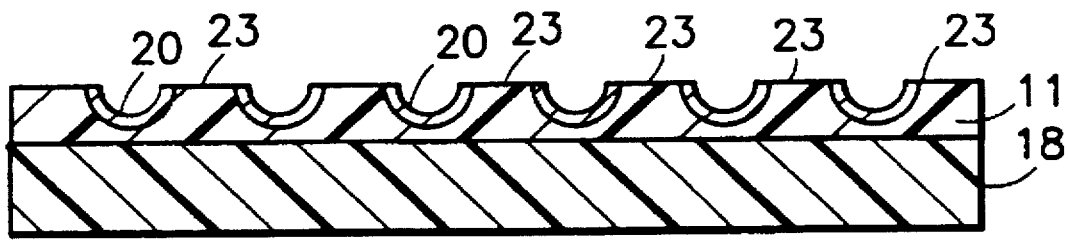
FIG. 1E is a side view of a PB containing the debossed laminate of FIG. 1D, in which surface loft is stripped away from the non-circuit area of the PB.

Curing of film 11 can take place when foil surfaces 15 and 17 have penetrated the contiguous surface of film 11. In such an embodiment, the assembly of foil 14, film 11 and substrate 18, as shown in FIG. 1C, can be placed in an oven and with foil 14 contiguous with film 11. While in the oven, the viscosity of film 11 is reduced, and this allows debossed foil 14 to readily penetrate film 11. Thus foil 14 and film 11 are pressed together so that the pattern of surfaces 15 is debossed into film 11. The composite is heated to effect gellation or incipient gelation or total cure of film 11. The composite is then removed from the oven and cooled. This results as shown in FIG. 1D in a composite in which debossed foil 21 is embedded in film 11, with foil lined grooves 20. If foil 14 does not contain a release agent, the adhesive nature of film 11 tenaciously bonds foil 21 to film 11. If it is desired to leave foil 21 in contact with film 11, then that composite may be subjected to an abrading action to remove foil from the top surfaces of film 11, i.e., surfaces 23, leaving foil 21 in grooves 20 of the resulting printed circuit board, as shown in FIG. 1E. In the case where foil 21 is left in grooves 20, it is not desirable to put a release agent on all of the surface of foil 14 that is contiguous to film 11. In this case, in a preferred embodiment, it is desirable to print the contiguous side of foil 14 with a pattern of the release agent coating that corresponds to the pattern of surface 23. In this way, foil 21 can be wiped from the surface of debossed film 11, as shown in FIG. 1D, in much the same way that unglued gold leaf is removed in making gold leaf finished signs, to obtain the PB pattern of FIG. 1E. Abrasion of bonded metal foil from the non-grooved and non-cavity surfaces of the cured film 11 may be effected by standard sanding belts or wheels and high pressure water streams. In this respect, reference is made to FIG. 5A and related description as appears in copending application Ser. No. 08/474,929, filed on even date herewith (Attorney's Docket No. HY031).

The use of debossed foil 14 in making the printed circuit board can serve, as indicated above, the function of transferring a metal conductive film into the grooves and sockets for chips and other peripheral circuit components affixed to the PB. These components can be solder-connected to the conductive film in the grooves and sockets of the PB.

Figure 2:
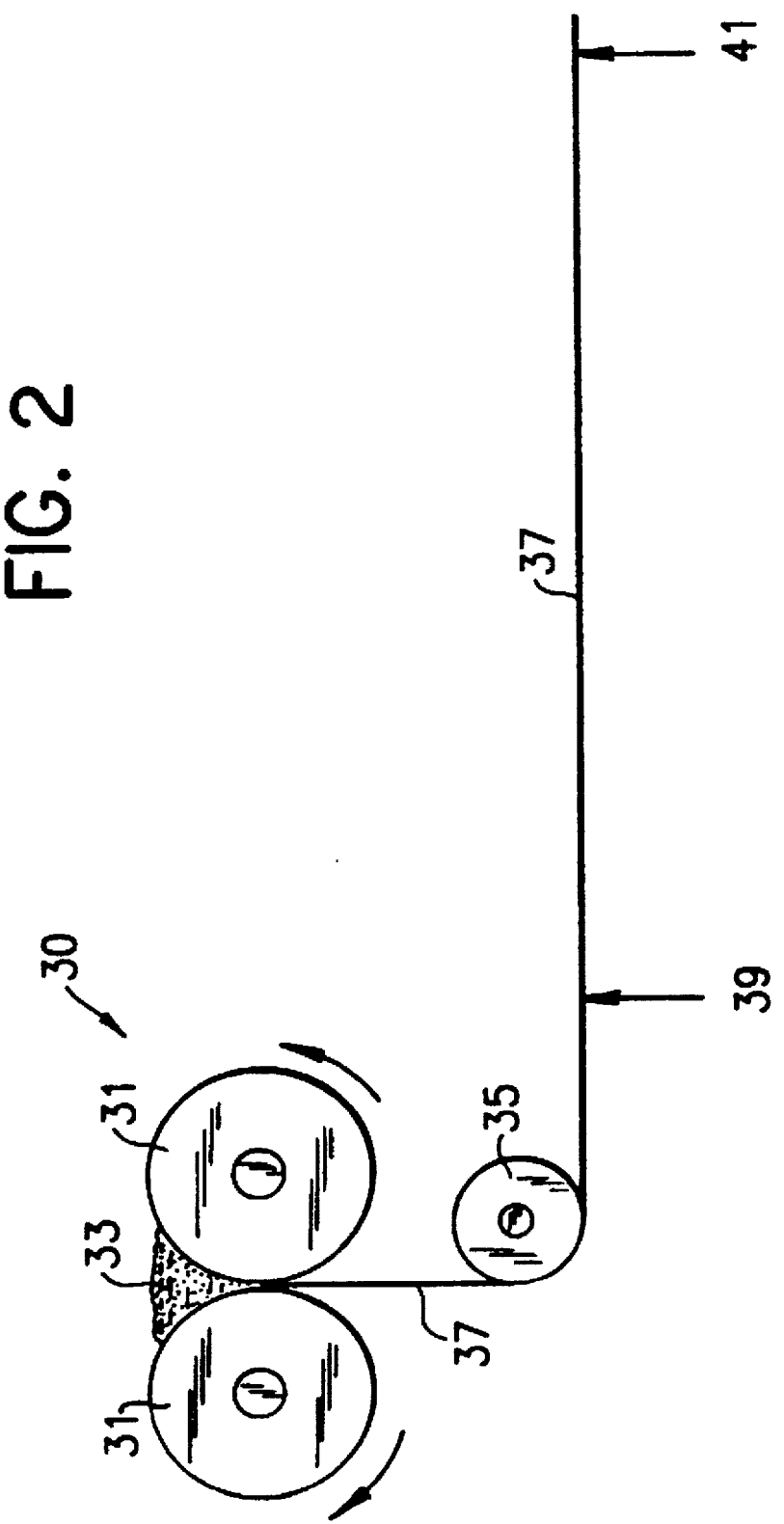
FIG. 2 is a schematic side view of a line for the continuous production of the resin film of the invention.

Calendaring the resin formulation is a desirable way of making the thin films used in the invention. This is illustrated in the drawings. As shown in FIG. 2, which is a schematic illustration of a calendaring line 30 for calendaring a shapeable film. The thermosetting matrix resin formulation feed 33 is fed to nip rolls 31. Nip rolls 31 are calendar rolls spaced apart to the desired thickness of the film 37. It is desirable in the practice of the invention to avoid drawing action of film 37 after formation by rolls 31. Rolls 31 may vary in width, wider rolls generating more throughput and narrower rolls providing more control over film thickness from edge to edge. Because this invention is concerned with films of essentially uniform thickness from edge to edge, and front to back, it is desirable to use calendar rolls that are less than about 60 inches wide. A convenient width is about 40 to about 48 inches. Manufacture of films meeting the specifications of this invention are easier at those widths. The distance between rolls 31 is maintained by a force balance (not shown) between the hydraulic pressure pushing on the roll and the off-setting matrix fluid pressure acting in the opposite direction to the roll.

Once film 37 is formed, it is frequently desirable to reduce the matrix resin viscosity in the film. Temperature reduction of film 37 reduces viscosity that reduces flow within the film and thus helps to preserve its dimensions. This may be accomplished by passing film 37 over one or more chilled rollers 35. If used as chilled rollers, they are typically internally cooled via internal jacketing, to temperatures from about 0° C. to about 25° C., preferably from about 10° C. to about 16° C., sufficiently low enough to prevent any sagging or flow of the resin matrix. The chill rollers, by cooling the film, increase the resin's elastic modulus so that resin flow is decreased and film dimensional stability is maintained. In the configuration of FIG. 2, roller 35 may be utilized as a chilled roller, a guide roller for alignment purposes and/or a take-up roller, as desired. For handling convenience, release paper or plastic (viz., polyethylene film) layers (not shown) may be applied to the outside surfaces of film 37, from their corresponding core rolls, to form a sandwiched construction. Continuous density measurements are taken at point 39 and physical areal weight measurements taken at point 41. Feedback from both of these measurements may be used to adjust the gap between the nip rolls 31, thus controlling thickness. Thickness control may be enhanced by use of statistical process control to indicate when nip gap adjustments are required.

Figure 3:
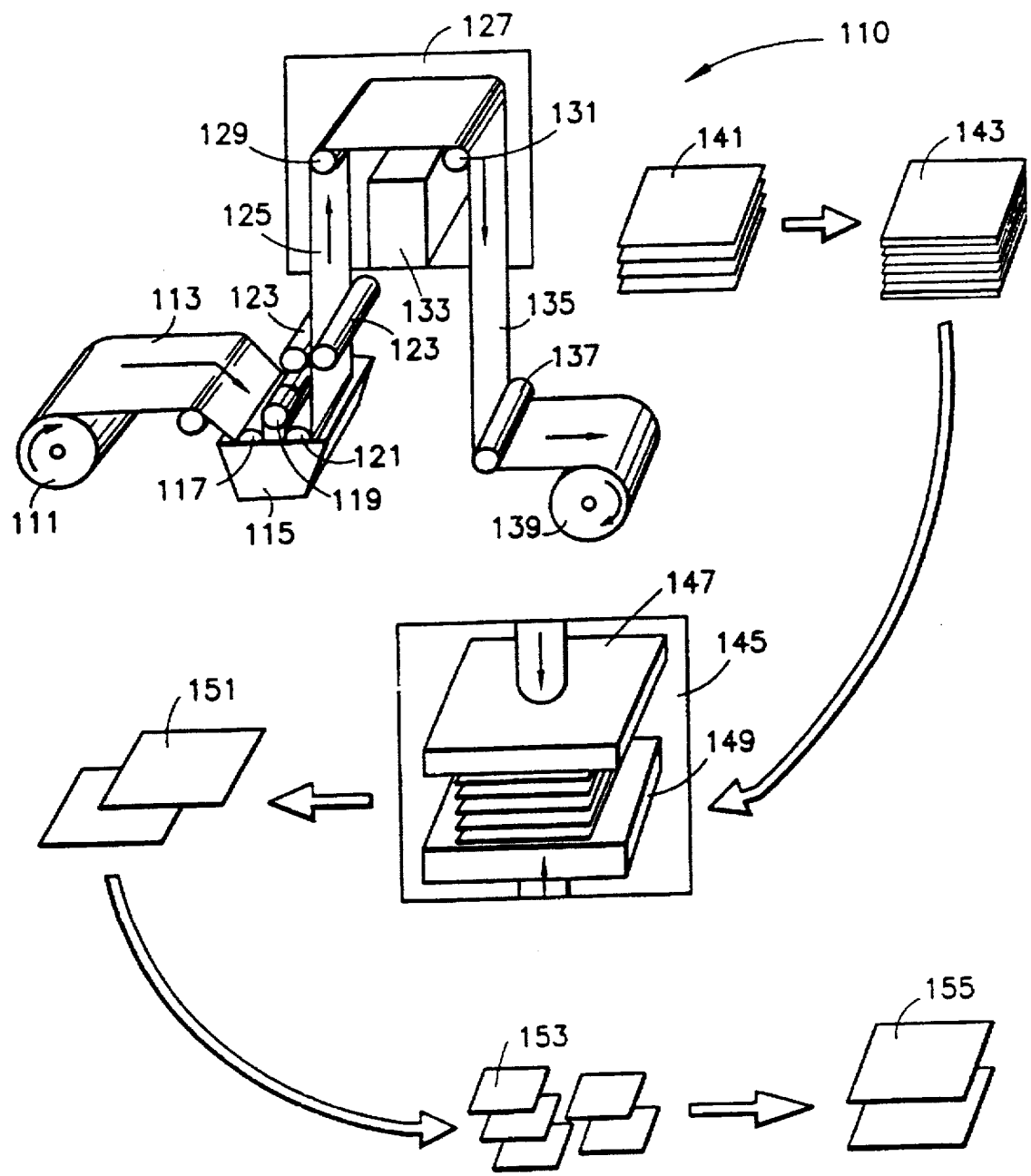
FIG. 3 is a schematic view of a prior art system for making PB's.

FIG. 3, which relates to a prior art process for making flat board PB's, describes unrolling glass fiber fabric from fiber glass fabric roll 111, passing continuous sheet 113 of glass fiber fabric into resin trough 115 via guide rollers 117, over guide roller 119 and under guide roller 121. The number of guides shown is symbolic and not necessarily indicative of how the resin impregnation step is specifically carried out. Trough 115 contains sufficient A-stage thermosetting resin to allow the desired impregnation of the fabric. The fabric withdrawn from trough 115 is fed through squeeze rolls 123 set to nip fabric 125 and reduce the level of resin therein. Fabric 125, containing A-stage thermosetting resin, is fed to treater 127 containing heater 133. Fabric 125 is fed over guide roller 129, past heater 133 and then over guide roller 131. In treater 127, polymerization of the A-stage resin is initiated so that the thermosetting resin in fabric sheet 135, is transformed to a B-stage resin. Prepreg fabric sheet 135 is guided by roller 137 to collection roll 139. The prepreg fabric 135 is, at a separate station, unrolled and cut to sized individual sheets 141. They are then superimposed to form a multi-layer prelaminate lay-up structure 143 containing copper foil on the outside top and bottom surfaces of the multiple superimposed prepreg sheets. The lay-up structure 143 is inserted into laminator 145 comprising a platen press containing upper heated platen 147 and lower heated platen 149. With pressure and heat, typically around 350° F., the B-stage resin is cured to form copper clad laminate 151. [See footnote 1 above] Laminate 151 is trimmed and sized to form finished laminates 153 that are then put into packages 155 and shipped to the PB producer.

We claim:

1. A method for laminating a shaped metal foil and a thin isotropic uncured and ungelled dielectric thermosetting resin film layer and forming an adhesively joined laminate conforming at one surface to essentially the shape of the metal foil which comprises superimposing a shaping tool containing a surface containing the desired shape and forcing the shaped surface and a surface of the metal foil into intimate contact to deform the metal foil to assume essentially the shapes of the surface, separating the metal foil from contact with the surface and putting the shaped metal foil in contact with a surface of a thin uncured and ungelled thermosetting resin film, which resin film contains, as its major ingredients, (i) a thermosetting resin that advances in molecular weight without forming a significant volatile byproduct, and (ii) a flow control component capable of laminating a three dimensionally shaped debossed foil, in which the resin film has a) an uniform areal thickness ranging from about 1 to about 250 mils as calculated from the weight of resin film for a given area;

b) minimum and maximum thicknesses not exceeding the deviation factors set forth in Table A

TABLE A

| Range in Mils | Deviation Factor |
|---|---|
| 1 to 5 | ±1 mil |
| 5 to 10 | ±2 mils |
| 10 to 250 | ±20% | c) low flow at a broad temperature range;

d) the ability, to cure, gel, or near-gel, at temperatures from about 20° C. to about 250° C., in less than about 7 days and more than 1 second; and e) a low dielectric constant in the thermoset state; wherein the flow control agent is one or more of:

i) one or more electronic grade fillers;

ii) a thermoplastic resin that is soluble or partially soluble in the thermosetting resin;

iii) an elastomer-type polymer that provides discrete elastomer phases in the thermosetting resin matrix; and iv) a thixotrope;

impressing the foil into the film surface without significantly altering the shape of the foil and causing the film surface to deform and assume the shape of the foil, applying conditions to the film such that the film assumes a set condition and the foil is adhesively bonded to the film.

2. The method of claim wherein the foil is debossed with a tool containing a raised electrical circuit pattern thereon, which comprises the step of impressing the tool onto the foil layer surface thereby causing the foil layer to be debossed by the raised electrical circuit pattern on the tool.

3. The method of claim 2 wherein the debossed laminate is subjected to conditions that effect one of near-gelation, gelation and cure of the attached resin film and adheres the retained pattern of the metal foil layer in the resin layer of the laminate.

4. The method of claim 3 wherein the laminate is heated to effect one or more of cure and post cure of the attached resin film.

5. The method of claim 2 wherein the pattern on the tool comprises embossed fine lines characterizing an electrical circuit of a PB.

6. The method of claim 3 wherein the pattern on the tool comprises embossed fine lines characterizing an electrical circuit of a PB.

7. The method of claim 4 wherein the pattern on the tool comprises embossed fine lines characterizing an electrical circuit of a PB.

8. The method of claim 5 wherein the electrical circuit pattern debossed in the foil comprising one or more of grooves, cavities, channels, ridges, sockets and plateaus.

9. The method of claim 1 wherein the dielectric thermosetting resin film layer exhibits controlled-flow and exhibits flow under pressure at a temperature below the near-gel and gel temperature of the thermosetting resin.

10. The method of claim 2 wherein the dielectric thermosetting resin film layer exhibit controlled-flow and exhibits flow under pressure at a temperature below the near-gel and gel temperature of the thermosetting resin.

11. The method of claim 3 whereto the dielectric thermosetting resin film layer exhibits controlled-flow and exhibits flow under pressure at a temperature below the near-gel and gel temperature of the thermosetting resin.

12. The method of claim 4 wherein the dielectric thermosetting resin film layer exhibits controlled-flow and exhibits flow under pressure at a temperature below the near-gel and gel temperature of the thermosetting resin.

13. The method of claim 1 wherein the surface of the dielectric thermosetting resin film layer that is opposite to the surface that contacts the debossed metal foil is adhesively bonded to a supporting layer.

14. The method of claim 2 wherein the surface of the dielectric thermosetting resin film layer that is opposite to the surface that contacts the debossed metal foil is adhesively bonded to a supporting layer.

15. The method of claim 3 wherein the surface of the dielectric thermosetting resin film layer that is opposite to the surface that contacts the debossed metal foil is adhesively bonded to a supporting layer.

16. The method of claim 4 wherein the surface of the dielectric thermosetting resin film layer that is opposite to the surface that contacts the debossed metal foil is adhesively bonded to a supporting layer.

17. The method of claim 1 wherein the supporting layer comprises a fabric.

18. The method of claim 1 wherein the supporting layer comprises a thermoplastic polymer.

19. The method of claim 1 wherein the supporting layer comprises fibers.

20. The method of claim 2 wherein the supporting layer comprises a fabric.

21. The method of claim 2 wherein the supporting layer comprises a thermoplastic polymer.

22. The method of claim 2 wherein the supporting layer comprises fibers.

23. The method of claim 3 wherein the supporting layer comprises a fabric.

24. The method of claim 3 wherein the supporting layer comprises a thermoplastic polymer.

25. The method of claim 3 wherein the supporting layer comprises fibers.

26. The method of claim 4 wherein the supporting layer comprises a fabric.

27. The method of claim 4 wherein the supporting layer comprises a thermoplastic polymer.

28. The method of claim 4 wherein the supporting layer comprises fibers.

29. The method of claim 1, wherein the electrically conductive metal foil layer is deposited or wrought foil and has an uniform thickness between about 0.1 mil ($2.54 \times 10^{-4}$ cm) to about 20 mils ($5.08 \times 10^{-2}$ cm); varying ±10 percent for deposited foils and ±5 percent for wrought foils.

30. The method of claim 2 wherein the electrically conductive metal foil layer is deposited or wrought foil and has an uniform thickness between about 0.1 mil ($2.54 \times 10^{-4}$ cm) to about 20 mils ($5.08 \times 10^{-2}$ cm); varying ±10 percent for deposited foils and ±5 percent for wrought foils.

31. The method of claim 3 wherein the electrically conductive metal foil layer is deposited or wrought foil and has an uniform thickness between about 0.1 mil ($2.54 \times 10^{-4}$ cm) to about 20 mils ($5.08 \times 10^{-2}$ cm); varying ±10 percent for deposited foils and ±5 percent for wrought foils.

32. The method of claim 4 wherein the electrically conductive metal foil layer is deposited or wrought foil and has an uniform thickness between about 0.1 mil ($2.54 \times 10^{-4}$ cm) to about 20 mils ($5.08 \times 10^{-2}$ cm); varying ±10 percent for deposited foils and ±5 percent for wrought foils.

33. The method of claim 1 wherein the dielectric resin film has an unimpeded thickness that is at least equal to that of the foil film bonded to it.

34. The method of claim 2 wherein the dielectric resin film has an unimpeded thickness that is at least equal to that of the foil film bonded to it.

35. The method of claim 3 wherein the dielectric resin film has an unimpeded thickness that is at least equal to that of the foil film bonded to it.

36. The method of claim 4 wherein the dielectric resin film has an unimpeded thickness that is at least equal to that of the foil film bonded to it.

37. The method of claim 29 wherein the dielectric resin film has an unimpeded thickness that is at least equal to that of the foil film bonded to it.

38. The method of claim 30 wherein the dielectric resin film has an unimpeded thickness that is at least equal to that of the foil film bonded to it.

39. The method of claim 32 wherein the dielectric resin film has an unimpeded thickness that is at least equal to that of the foil film bonded to it.

40. The method of claim 33 wherein the dielectric resin film has an unimpeded thickness that is at least about 1.2 times thicker than the thickness of the foil film.

41. The method of claim 34 wherein the dielectric resin film has an unimpeded thickness that is at least about 1.2 times thicker than the thickness of the foil film.

42. The method of claim 35 wherein the dielectric resin film has an unimpeded thickness that is at least about 1.2 times thicker than the thickness of the foil film.

43. The method of claim 36 wherein the dielectric resin film has an unimpeded thickness that is at least about 1.2 times thicker than the thickness of the foil film.

44. The method of claim 37 wherein the dielectric resin film has an unimpeded thickness that is at least about 1.2 times thicker than the thickness of the foil film.

45. The method of claim 38 wherein the dielectric resin film has an unimpeded thickness that is at least about 1.2 times thicker than the thickness of the foil film.

46. The method of claim 39 wherein the dielectric resin film has an unimpeded thickness that is at least about 1.2 times thicker than the thickness of the foil film.

47. The method of claim 1 wherein the thermosetting resin is isotropic wherein the method is carried out in batch mode.

48. The method of claim 2 wherein the thermosetting resin is isotropic wherein the method is carried out in batch mode.

49. The method of claim 3 wherein the thermosetting resin is isotropic wherein the method is carried out in batch mode.

50. The method of claim 1 carried out as a batch process wherein the method is carried out in batch mode.

51. The method of claim 2 carried out as a batch process wherein part of the method is carried out in continuous mode.

52. The method of claim 3 carried out as a batch process wherein part of the method is carried out in continuous mode.

53. The method of claim 1 carried out as a batch process wherein part of the method is carried out in continuous mode.

54. The method of claim carried out as a semi-continuous process.

55. The method of claim 2 carried out as a semi-continuous process wherein all of the method is carried out in continuous mode.

56. The method of claim 3 carried out as a semi-continuous process wherein all of the method is carried out in continuous mode.

57. The method of claim 4 carried out as a semi-continuous process wherein all of the method is carried out in continuous mode.

58. The method of claim 1 carried out as a continuous process wherein all of the method is carried out in continuous mode.

59. The method of claim 2 carried out as a continuous process.

60. The method of claim 3 carried out as a continuous process.

61. The method of claim 4 carried out as a continuous process.

62. The method of claim 1 wherein either the surface of the metal foil that is to contact the thermosetting resin film, or the thermosetting resin film before contacting the metal foil, has printed on it a release agent coating that replicates the non-raised portion of the raised electrical circuit pattern which is to be debossed into the foil-resin composite.

63. The method of claim 62 wherein the printing may be effected by a release agent deposition step effected by transferring release agent from a) transfer sheets to the metal foil film, or b) through screens to the metal foil film, or c) by application from rotogravure rolls, to the metal foil film.

* * * * *